United States Patent [19]

Saucedo et al.

[11] Patent Number: 5,754,738
[45] Date of Patent: May 19, 1998

[54] COMPUTERIZED PROTOTYPING SYSTEM EMPLOYING VIRTUAL SYSTEM DESIGN ENVIROMENT

[75] Inventors: Robert Saucedo, Palos Verdos Estates, Calif.; Kootala P. Venugopal, Greenbelt, Md.

[73] Assignee: CAMC Corporation, Torrance, Calif.

[21] Appl. No.: 660,379

[22] Filed: Jun. 7, 1996

[51] Int. Cl.$^6$ .............................. G06F 15/18; G06F 17/20
[52] U.S. Cl. .................. 395/12; 395/10; 395/22; 395/50
[58] Field of Search ........................ 395/22, 23, 229, 395/500, 10–12, 50–51; 364/468.03, 468, 148

[56] References Cited

U.S. PATENT DOCUMENTS

| | | | |
|---|---|---|---|
| 4,875,162 | 10/1989 | Ferriter et al. | 364/401 |
| 4,965,741 | 10/1990 | Winchell et al. | 364/513 |
| 5,283,857 | 2/1994 | Simoudis | 364/77 |
| 5,297,054 | 3/1994 | Kienzle et al. | 364/474.24 |
| 5,297,057 | 3/1994 | Kramer et al. | 364/512 |
| 5,333,237 | 7/1994 | Stefanopoulos et al. | 395/12 |
| 5,446,652 | 8/1995 | Peterson et al. | 364/578 |
| 5,450,527 | 9/1995 | Wang | 395/22 |
| 5,552,995 | 9/1996 | Sebastian | 364/468.03 |
| 5,555,406 | 9/1996 | Nozawa | 395/500 |

*Primary Examiner*—Tariq R. Hafiz
*Attorney, Agent, or Firm*—Jones & Volentine, L.L.P.

[57] ABSTRACT

In a computer prototyping system, a design is identified from a collection of alternative designs, the identified design best satisfying a set of conceptual level design specifications. One of these alternative designs is selected and their characteristic optimized based on the conceptual level design specifications. The specifications are modified interactively using graphical interfaces for re-evaluating and re-optimizing the designs. Simulation of functional as well as geometrical properties of the design and its components are effected on a computer using graphical design browsers. The performance is analyzed against a set of design specification and the user is allowed to interactively redesign by selecting one of the previous design operations through the graphical interfaces.

7 Claims, 26 Drawing Sheets

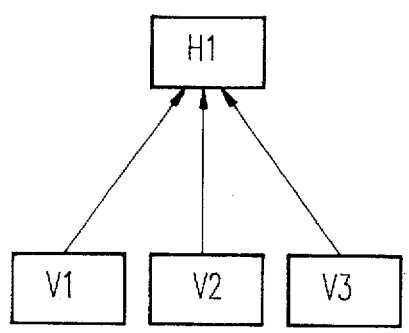
FIG.8
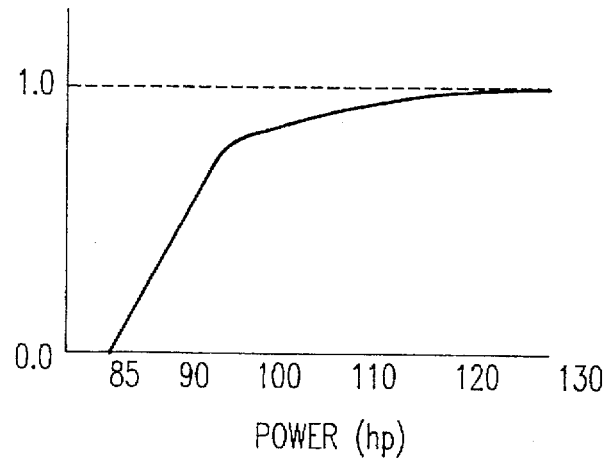
FIG.9
FIG.10A
POWER (hp)
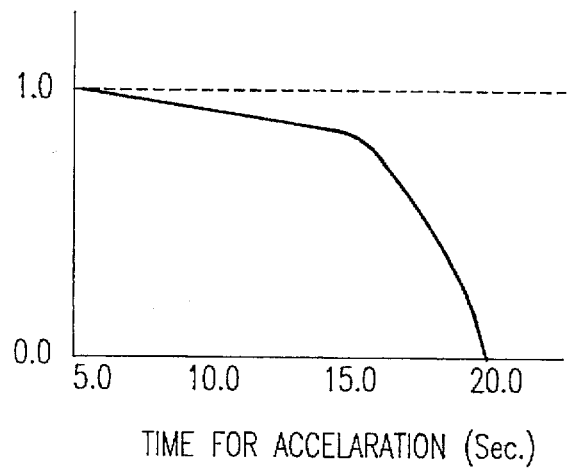
FIG.10B
TIME FOR ACCELARATION (Sec.)

CAMC Corporation (1995, 1996)

OPIMIZATION AND DECISION SUPPORT SYSTEM
Copyright: 1995,1996 CAMC Corporation LOAD A DEMO EXAMPLE?:   (Yes)   (No)

SPECIFY THE TASK NAME:   [Four Wheel Drive]

NUMBER OF DECISION/OPTIMIZATION STAGES: [3 ▽]

VARIABLES:      (NEW) (EDIT) (Variables ▽) (Load)
WEIGHTAGES:     (NEW) (EDIT) (Weights ▽) (Load)
REQUIREMENTS:   (NEW) (EDIT) (Objectives ▽) (Load)
SPECIFICATION DATABASE:   (VIEW)   (EDIT)   (LOAD)
DURATION FOR OPTIMIZATION(Sec.) [20 ▽]  [System Components]

OPTIMIZE BASED ON ALL/EACH REQUIREMENTS: [EACH  ALL]

(DOWN SELECT)      (OPTIMIZE ▽)      (RESULTS ▽)

(DECISION TREES)   (OPTIMIZED DEC. TREES)

(INPUT VALUES)     (OPTIMIZED INPUT VALUES)

Optimizing Variable Attributes            (Quit)

FIG.11

☑ Text Editor V3 — Four_Wheel_Drive_var.0

File ▽   View ▽   Edit ▽   Find ▽ accelaration::a0_30
accelaration::a0_60
accelaration::a30_50
accelaration::a50_70 handling::double_lane
handling::slalom braking::cold
braking::warm
braking::hot interior_noise::idle
interior_noise::n60MPH
interior_noise::n0_60MPH mileage::city
mileage::highway powertrain::engine::size
powertrain::engine::OHV
powertrain::engine::power
powertrain::engine::torque
powertrain::engine::compression
powertrain::transmission
powertrain::drive_ratio △ dimensions::wheelbase
dimensions::length ☑ Text Editor V3 — Four_Wheel_Drive_const0,di File ▽   View ▽   Edit ▽   Find ▽

△ #accelaration::preferred::negative

MEDIUM::LOW
MEDIUM::MEDIUM
MEDIUM::MEDIUM
MEDIUM::LOW handling::preferred::positive

MEDIUM::HIGH
MEDIUM::MEDIUM braking::preferred::negative

LOW::MEDIUM
LOW::MEDIUM
LOW::MEDIUM interior_noise::preferred::negative

MEDIUM::MEDIUM
MEDIUM::LOW
MEDIUM::MEDIUM mileage::preferred::positive

HIGH::HIGH
HIGH::HIGH powertrain::preferred::positive

☑ Text Editor V3 — Four_Wheel_Drive_obj.0, dir

File ▽   View ▽   Edit ▽   Find ▽ accelaration::LOW
△ price::MEDIUM
maintenance::HIGH
powertrain::VERY_HIGH
chassis::HIGH
mileage::HIGH
dimensions::HIGH overall::GREATER_THAN::0.8

FIG.12

| 1 | ACCELARATION |
| 2 | PRICE |
| 3 | MAINTENANCE |
| 4 | POWERTRAIN |
| 5 | CHASSIS |
| 6 | MILEAGE |
| 7 | DIMENSIONS |

| | BATTERY | POWER DISTRIB. CIRCUIT | WHEEL DRIVE |
|---|---|---|---|
| BATTERY | X | MEDIUM | HIGH |
| POWER DISTRIB. CIRCUIT | VERY LOW | X | MEDIUM |
| WHEEL DRIVE | LOW | LOW | X |

|  | JOINT 1 | JOINT 2 | JOINT 3 | LINK 1 | LINK 2 | WRIST |
|---|---|---|---|---|---|---|
| JOINT 2 |  | 0 | 0 | 1 | 0 | 0 |
| JOINT 3 | 0 |  | 0 | 1 | 1 | 0 |
| LINK 1 | 0 | 0 |  | 0 | 1 | 1 |
| LINK 2 | 1 | 1 | 0 |  | 0 | 0 |
| WRIST | 0 | 1 | 1 |  |  | 0 |
| JOINT 1 | 0 | 0 | 1 | 0 | 0 |  |

|          | var 2 | var 3 | var 5 | var 6 | var 7 | var 8 |
|----------|-------|-------|-------|-------|-------|-------|
| Battery  | 1     | 0     | 0     | 1     | 0     | 0     |
| Casing   | 0     | 0     | 1     | 0     | 0     | 0     |
| PCB      | 0     | 0     | 0     | 1     | 0     | 0     |
| Cables   | 0     | 1     | 0     | 0     | 0     | 0     |
| Start. Ckts. | 0 | 0     | 0     | 0     | 1     | 0     |
| Motor    | 0     | 0     | 0     | 0     | 0     | 1     |

FIG.32

Motor

| var 8 |        | Size | Weight | Power |
|-------|--------|------|--------|-------|
|       | Sub var 1 | 1 | 0 | 0 |
|       | Sub var 2 | 0 | 0 | 1 |
|       | Sub var 3 | 0 | 1 | 0 |

FIG.33A

PCB

| var 6 |        | Size | Heat Dissip |
|-------|--------|------|-------------|
|       | Sub var 1 | 0 | 1 |
|       | Sub var 2 | 1 | 0 |

FIG.33B

COMPUTERIZED PROTOTYPING SYSTEM EMPLOYING VIRTUAL SYSTEM DESIGN ENVIROMENT

BACKGROUND OF THE INVENTION

1. Field of the Invention

The present invention is directed to a computerized prototyping system containing a virtual system design environment, and more particularly, to a computerized prototyping system which allows a user through a graphical user interface to dynamically change a model and to reevaluate its functions, and to automatically optimize the model with the help of a knowledged based expert system.

2. Description of the Related Art

The development of complex engineering systems initially requires levels of management and engineering decisions and trade-off studies. This design phase, normally called conceptual design phase, involves evaluation of a number of higher level performance and manufactorability requirements such as costs, profit, technical resources, market constraints, man power, and computing resources. These decisions in engineering designs are often done very heuristically, mainly based on the experience of the management and engineering design team.

It is estimated that about 80–90% of the product costs, engineering requirements and quality are decided at the first 20–25% of the design phase. This makes the conceptual design phase particularly important. Though there is a well established industry providing sophisticated computer aided Design (CAD) tools for detailed design of engineering systems, these tools are generally not suitable for the conceptual design phase.

SUMMARY OF THE INVENTION

The present invention is directed to a virtual system design environment (VSDE) which allows for an organized computer-implemented approach to conceptual design of complex systems. It provides a set of tools for systematically analyzing the decisions at the conceptual design phase, evaluation of candidate designs, higher level design optimization and virtual system prototyping. The application of VSDE is not restricted to the domain of engineering design analysis. It can be effectively used in a variety of applications such as management decision analysis, financial market evaluations, logistics, data mining and data interpretation.

The computer-implemented virtual system design environment solves the shortcomings of the current system design and analysis methodologies.

(1) The VSDE of the invention can be used for the entire design cycle of a system, starting from the conceptual design phase. It can easily analyze high level decision options against the performance requirements set forth by the designer, by adding, deleting or changing variables, associated constraints and design objectives. As mentioned previously, commercially available computer aided design (CAD) tools do not deal with conceptual design stage of system design.

(2) Prior knowledge about a decision process can be easily incorporated in the form of a knowledge based system (decision model). The designer can load an existing decision model or can create a new decision model during the conceptual design process. The decision model in the VSDE of the invention can be represented using fuzzy variables, allowing representation of decision uncertainties.

(3) The decision model can incorporate subsystems which are designed through the VSDE of the invention as well as external designs and analyze the overall system. Also, it allows optimization of the system parameters, incorporating these subsystems. For this optimization, exact mathematical representation of the subsystems need not be known. This aspect is a significant advantage over conventional Operations Research approach such as linear programming and nonlinear programming.

(4) Since the VSDE of the invention integrates all the stages in a typical system design, the design has complete flexibility in monitoring each stage in the design process, intermediate design parameters, and results of designs at each stage. This flexibility allows the designer to interrupt the process at any stage, modify the requirements or goals, or modify the variables and constraints.

(5) Any technological developments in subsystems can be readily incorporated into the VSDE of the invention, along with its constraints and interrelationships with other subsystems, effects of technological changes in subsystems and components on the overall system can be readily simulated and effects can be visualized.

BRIEF DESCRIPTION OF THE DRAWINGS

The above and other features of the present invention will become readily apparent to those skilled in the art from the detailed description which follows and from the accompanying drawings, in which:

FIG. 8 illustrates the variable interdependency in the analytical hierarchical process;

FIG. 9 shows a judgement matrix of the analytical hierarchical process;

FIGS. 10(a) and 10(b) illustrate power and acceleration utility functions, respectively;

FIG. 11 shows an example of an optimization and decision support system module front end graphical user interface;

FIG. 12 illustrates an optimization and decision support system module user interface for building decision trees, variable strength and performance objectives;

FIG. 32 is a model dependency matrix for the example shown in FIG. 30;

FIGS. 33(a) and 33(b) show submatrices for the model dependency matrix;

DETAILED DESCRIPTION OF THE PREFERRED EMBODIMENTS

Figure 35:
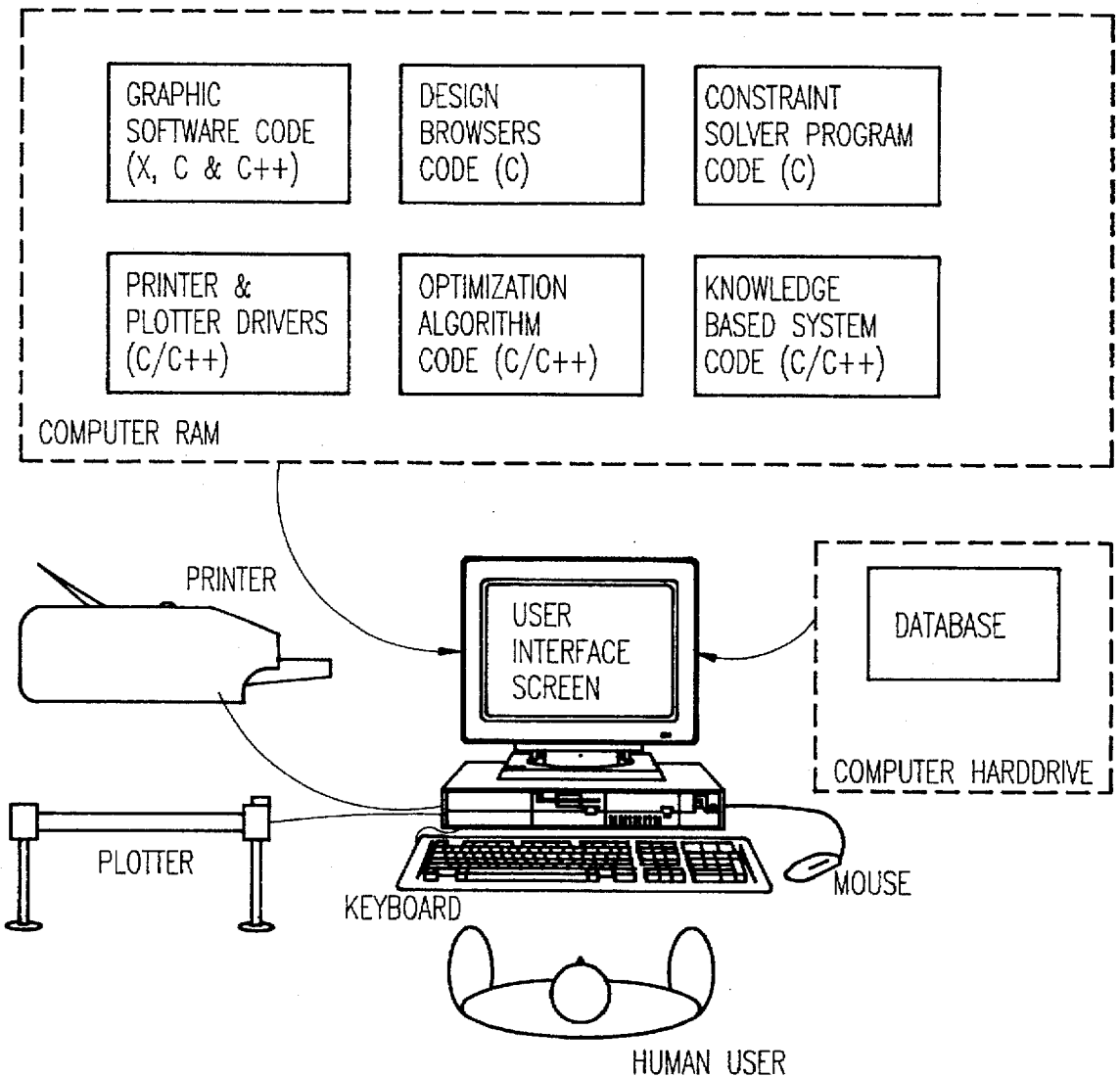
FIG. 35 is a schematic representing the general interrelationships between the human user and the computerized prototyping system of the invention.

Initially, attention is directed to FIG. 35 which shows a schematic representation of the general interrelationships between the human user and the computerized prototyping system of the invention, including the various components and associated interfaces. Stored in a computer RAM of the prototyping system are graphic software code, design browsers code, constraint solver program code, printer and plotter drivers, optimization algorithm code and knowledge base system code. Further, a computer hard drive contains the requisite database. Input devices include a keyboard and mouse, and a printer and plotter may be plotter may be provided in addition to the user interface screen.

Figure 1:
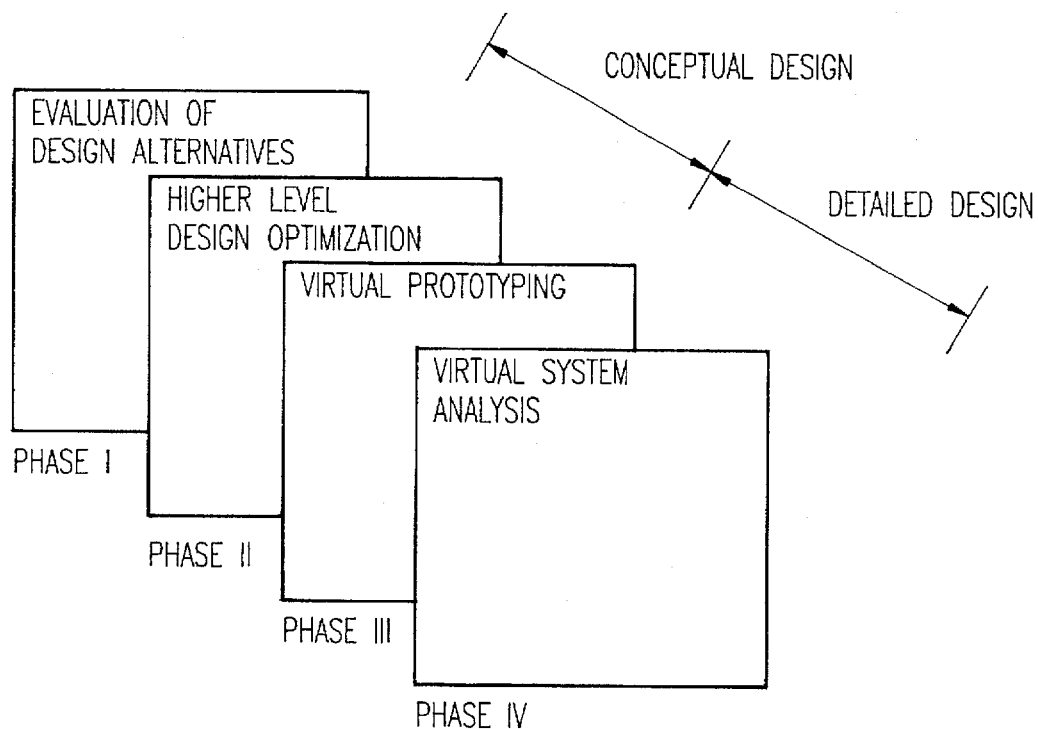
FIG. 1 illustrates an overview of the virtual system design environment of the computerized prototyping system of the present invention.

As shown in FIG. 1, the virtual system design environment of the present computerized prototyping system includes four major stages of operations: (a) Downselection of candidate designs; (b) Conceptual level design optimization; (c) Virtual design and prototyping; and (d) Virtual analysis of the designed systems (FIG. 1). The candidate design downselection and higher level design optimization stages are a part of the conceptual design process, while the virtual prototyping and virtual analysis stages correspond to the detailed design stages. In the conceptual design stages, exact mathematical representation of the model to be optimized need not be known. The user can build a model using the decision tree principles, with the interrelationships between the variables defined as fuzzy variables, such as mediums, high, very high etc. The conceptual design stage of VSDE is handled by a module called Optimization and Decision Support System (ODSS). ODSS allows the downselection of alternate designs and their high level design optimization.

Figure 2:
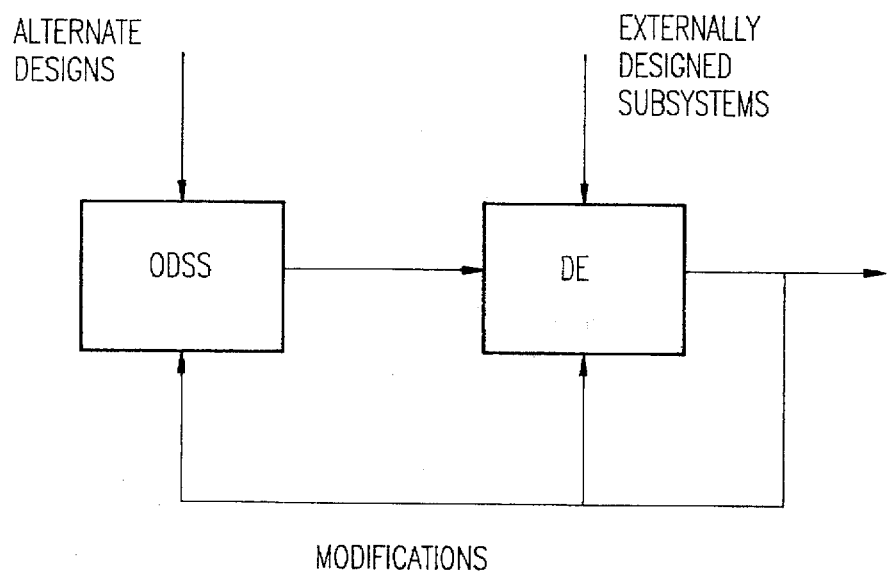
FIG. 2 illustrates components of the virtual system design environment.

The detailed design for the subsystems is done in the virtual prototyping stage, where solutions are estimated for a set of equations describing the subsystems. As shown in FIG. 2, in VSDE, these operations are a part of the Design Environment (DE) module. The designs always need not be performed inside the VSDE, the can be designed outside and ported into from commercial CAD systems. In the case of functional design tasks, the subsystem functionalities can be incorporated into VSDE either through mathematical representations or through models. If performance of design at any stage in VSDE does not meet the designer requirements, the designer can easily go back to one of the previous design stages for modifying the decision model, the variable structure or the performance requirements. In the Virtual System Analysis stage, the overall integrity of the subsystems are checked and analyzed.

Stage 1: Evaluation of Design Alternatives

The ODSS is a decision making system for evaluation of candidate designs. In many engineering design applications, a set of alternative designs may be known initially, and the primary task will be to choose the most closely matching design with respect to a set of performance requirements and then modify it to satisfy the performance requirements. When the design process evolves from a very crude initial design, the evaluation process may not be needed at the beginning. But, when the detailed design results in more than one design, the user may be needing to evaluate the designs and re-optimize them. In VSDE, such loop back between design modules is easily incorporated.

Figure 3:
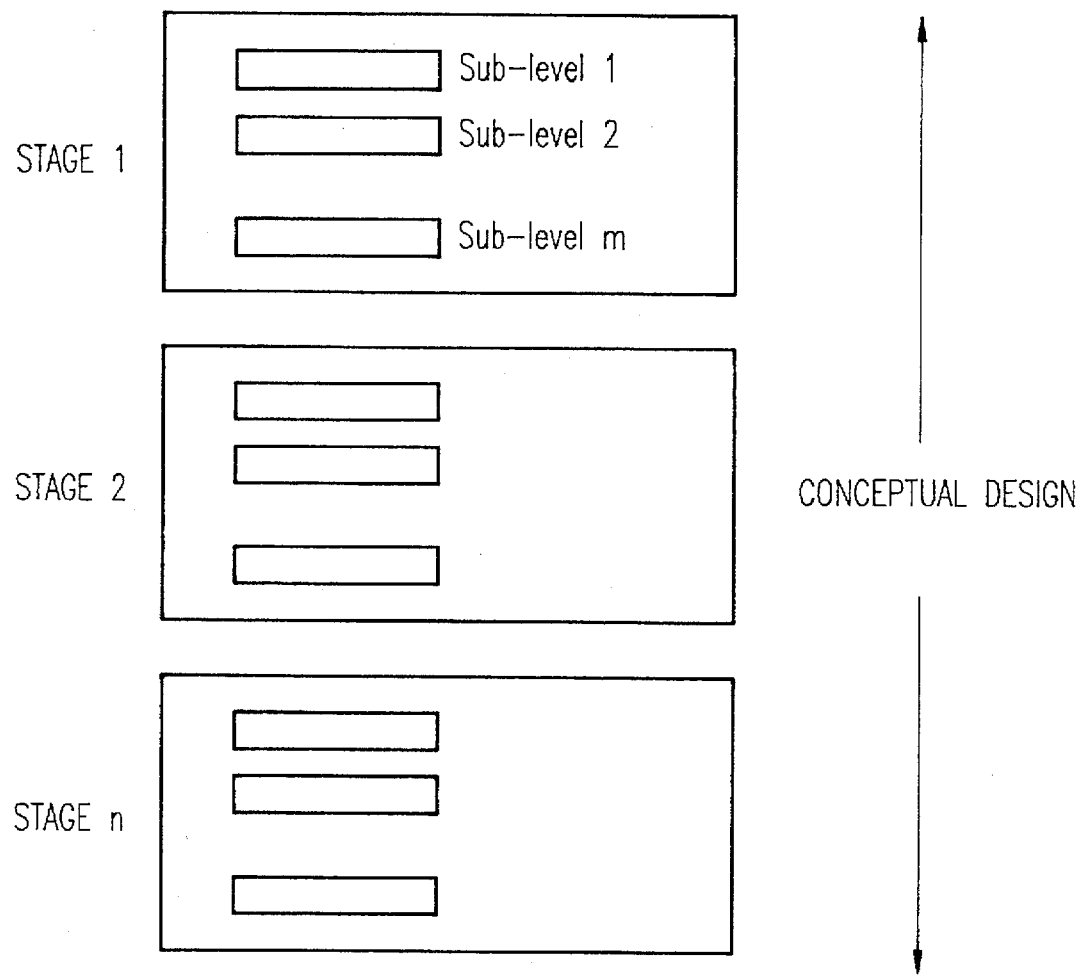
FIG. 3 shows a hierarchical representation of a conceptual design process.

In ODSS, the evaluation of alternatives and conceptual optimization of designs can be performed in stages. FIG. 3 shows such a staged conceptual design process. This allows the designer to build sub-dividing the conceptual design process. Each of these stages will be having a set of decision trees. Though variables in decision trees inside a stage can be interconnected, interconnection between variables in two different stages is not permitted.

Figure 4:
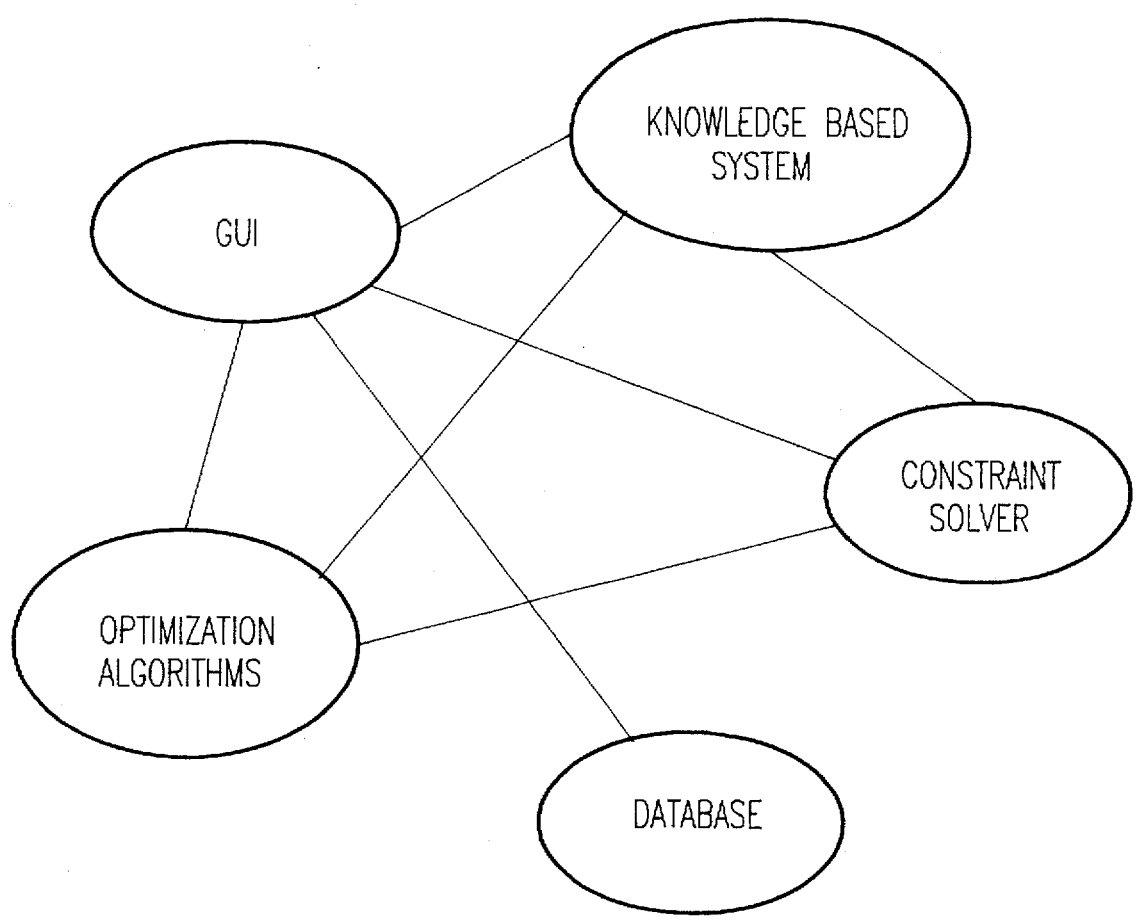
FIG. 4 shows components of an optimization and decision support system module.
Figure 5:
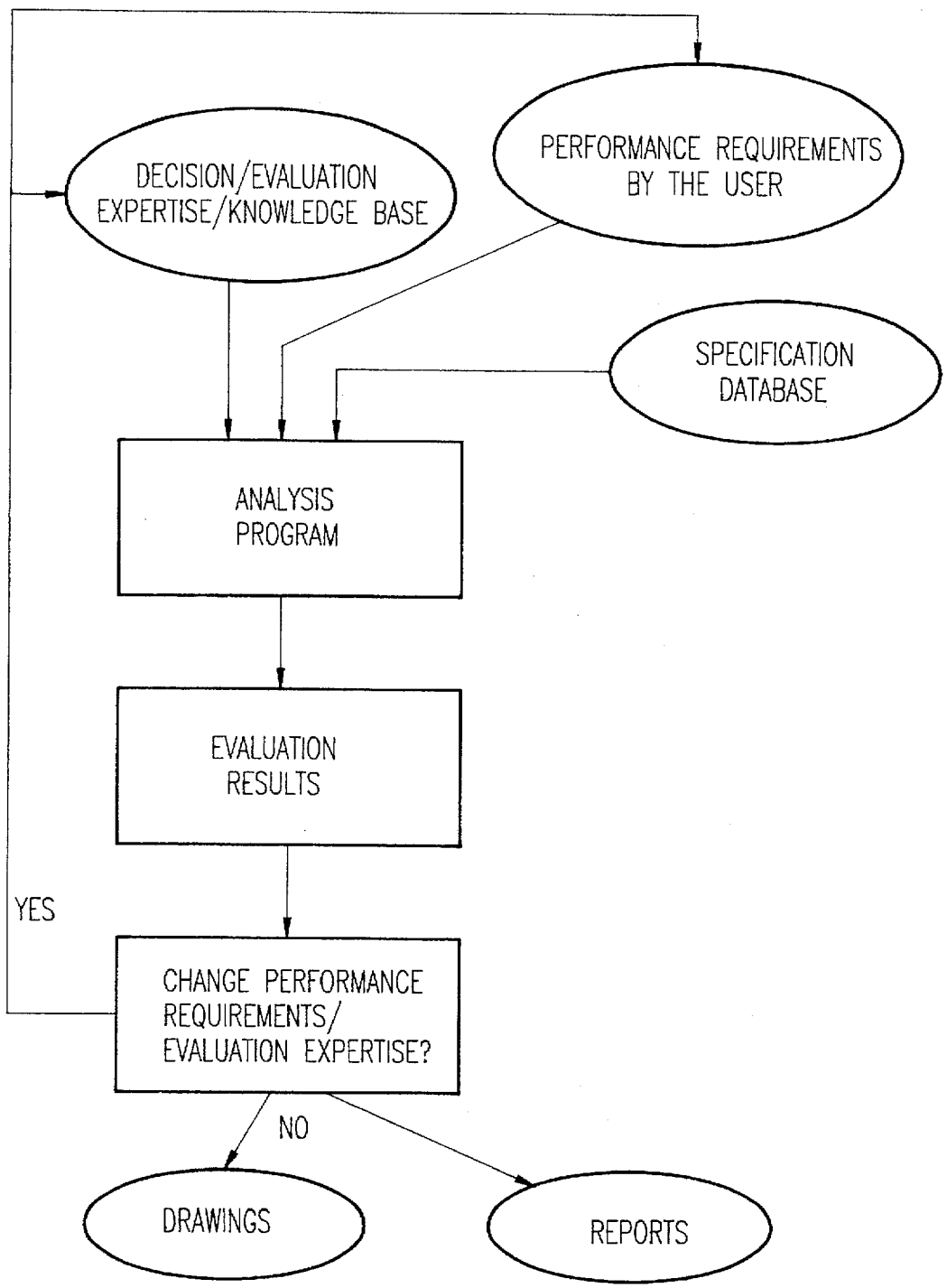
FIG. 5 is a functional diagram of a design evaluation process.

Each stage will be associated with a set of specification database, based up on which the decisions are made. The underlying decision process in ODSS consists of a Knowledge Based System in conjunction with constraint satisfaction algorithms and evaluation/optimization methods. The system consists of four individual modules; a model base, a knowledge base, a constraint solver and a set of optimization routines. The individual modules will be interacting with each other and with the user through Graphical User Interface (GUI). The components of the overall system is shown in FIG. 4. The flow-chart representation of the evaluation methodology is shown in FIG. 5.

Knowledge Based System

The Knowledge Based System (KBS) consists of an Artificial Intelligence (AI) based representation of the decision hierarchy, dependencies of the variables at each of the hierarchies and associated strengths of each variable. The decision hierarchy is represented as a decision tree, and at any instant the characteristics of each of the nodes can be determined from the KBS and the input database.

The designer either builds a KBS using the ODSS or loads a previously designed KBS into the ODSS. During the KBS building, variables at each level and their interconnection strengths are provided through a text edit window. The designer views the decision tree structure through the graphical user interface and makes any necessary changes to the model, at any time during the design process.

Figure 6:
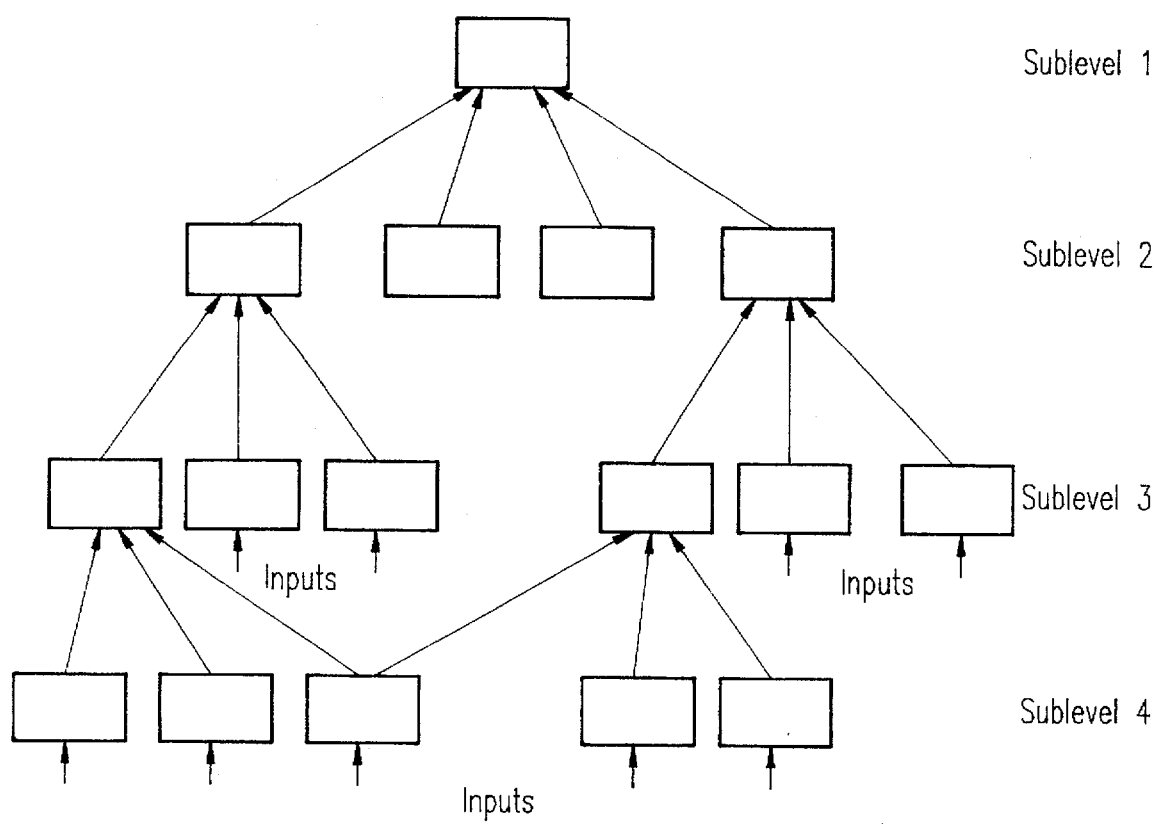
FIG. 6 illustrates a typical decision tree in the optimization and decision support system module.

The user has the flexibility to add or delete any variable at any level in the hierarchy, and determine its effect on the entire system. FIG. 6 details a typical decision tree in ODSS. In this case there are four levels of variable nodes. ODSS does not assume any restrictions on the number of levels or on the number of variables in each of the levels. For complex models and finer evaluations, the user expands the variables and associated structures, and perform the decision process.

In the decision tree shown in FIG. 6, there are four sublevels of variables and some of the sublevel variables are interconnected from other sublevel. Also, some of the sublevel hierarchies are deeper than the other ones. A deeper hierarchy corresponds to a finer decision model. Such flexibility in defining the interconnections and hierarchies allows ODSS to model complex decision and evaluation processes.

Figure 7:
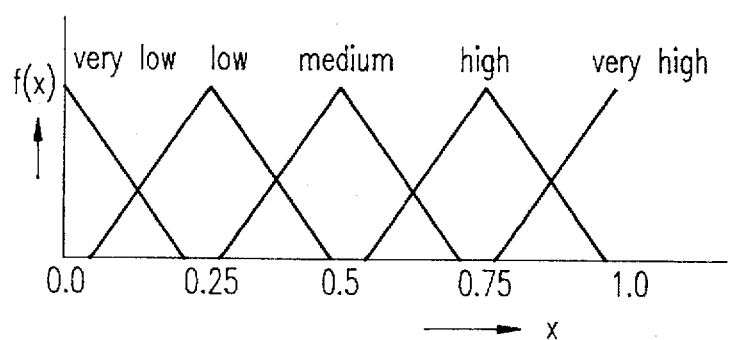
FIG. 7 shows fuzzy membership functions of variables.

The interconnection strengths can be assigned in terms of numerical values or fuzzy variables. The numerical range for the strengths is between 0.0 and 1.0. The fuzzy strength corresponds to a set of membership functions defined in this numerical range. The designer can choose the number of variables defined in this range depending on the refinement needed. FIG. 7 shows a set of typical membership functions used in ODSS.

When numerical values are used for defining the variable strengths in the decision hierarchy, ODSS incorporates a scheme based on Analytical Hierarchy Process (AHP) (see Gass, S., *Decision making: models and algorithms*, Krieger Publishing, 1991.) for establishing a set of consistent connection strengths.

Analytic Hierarchy Process

The Analytic Hierarchy Process (AHP) provides a convenient way to build the decision model for downselection and optimization. The model is built by comparing the variables in a level pairwise. In FIG. 8, let V1, V2, V3 be three variables in a level, in one of the branches H1, in the decision tree.

The user assigns a set of pairwise weighting for the variables as shown below: Construct a 3×3 matrix with each element in the matrix representing the relative weights between the variable pairs. The weighting matrix will be n×n if the number of variables are n. For each row i of the matrix, take the product of the entries in that row ($\Pi_i$) and take the corresponding geometric mean $P_i$, where $P_i = \sqrt[3]{\Pi_i}$.

The normalized value of the geometric mean, $P_i$, denotes the priority or weight given to the $i^{th}$ alternative (Vi), i.e.

$$p_i = \frac{P_i}{\sum_i P_i}$$

In the example of
FIG. 9, $P_1 = \sqrt[3]{ab}$, $P_2 = \sqrt[3]{c/a}$, $P_3 = \sqrt[3]{1/bc}$. The consistency of the hierarchical model constructed by the user, can be checked by estimating a consistency index as follows.

Consider an AHP judgement matrix with n rows and n columns. Let $p_i$ be the corresponding AHP priorities. Calculate the maximum eigen value of the matrix:

$$\lambda_{max} = p^1 \sum_{i=1}^{n} a_{i1} + p_2 \sum_{i=1}^{n} a_{i2} + \ldots + p_n \sum_{i=1}^{n} a_{in}$$

A consistency index CI can be represented by $$CI = \frac{\lambda_{max} - n}{n - 1}.$$

This consistency index CI is then compared with a random consistency index RI, and a consistency ratio CR=CI/RI is calculated. RI is the average consistency index for a matrix of size n, whose reciprocal entries are drawn at random between 1/9 and 9. A weighing model is accepted if the consistency ratio CR is less than or equal to 0.10.

Constraint Solver

The constraint solver will be handling all the constraints to be satisfied in the decision process. The constraints can be of two types; required constraints or preferred constraints. The preferred constraints can have a hierarchy of strengths; for example, from very low to very high (see Zadeh, L.A., Fuzzy sets, *Information and Control*, 1965, pp. 338-353). A result which satisfies all the required constraints can be taken as an admissible one; which can be considered for a closer evaluation based upon the preferred set of constraints. In general, the constraint solver should be able to handle: adding a variable, removing a variable, adding a constraint and removing a constraint. The system should re-evaluate itself in these cases.

The property of the constraint solver to handle adding/ removing of variables and constraints is very important in ODSS. The implications of future technology on subsystems as well as on the overall system will be incorporated through variables and constraints. Any constraint solving algorithm we develop or adopt should have this characteristics. Such an ability is also crucial in making the overall methodology very general to be used with design and downselection of very wide range of engineering systems.

Model Database

Each of the decision stages in ODSS has an associated model database. Model database consists of the specifications and functional details of the design alternatives under consideration. The database information provided needs to be consistent with the variable hierarchy defined in KBS. In ODSS, through the GUI, the designer can either build a new database or load an existing database. The interfacing is done through a text edit window, as in the case of variable hierarchy and strengths. The designer also provides the range of each of the database entries and the utility function to be used for converting the specifications into a common dimension.

Utility functions translate diverse input characteristics into a common scale. The range of utility curve encompasses the range of acceptable or realistic alternatives. The transformed range in ODSS is 0-1.0. The zero point for each utility curve indicates the level of performance which no longer provides effective value to the system performance. Each of the input variables in the decision model is associated with a utility curve.

In principle, there can be two types of input variables in a decision tree, a variable which produces positive effects for higher values, or a variable which produces negative effects for higher values. For example, in the design of a motor vehicle, power may be a positive variable while time for acceleration can be a negative variable. FIGS. 10(a) and 10(b) shows examples of utility functions for positive and negative variables. ODSS has a library of utility functions and the designer can specify one of them for each of the database variables.

The Graphical User Interface

The Graphical User Interface is an important component of ODSS and VSDE. In using the VSDE, many of the flexibility comes from user-friendly GUIs. Mainly there are three types of interfaces in ODSS. The front end where the designer selects all the necessary settings for starting the design and evaluation process; a set of text editor windows for building the decision model, variable hierarchy, database and specification of performance objective; a set of graphics panels to display intermediate as well as final results. The front end interface also allows loading and execution of predefined examples and decision models. FIG. 11 shows the front end interface of ODSS and FIG. 12 shows the text edit windows for defining variable hierarchy, strengths and performance objectives.

Figure 13:
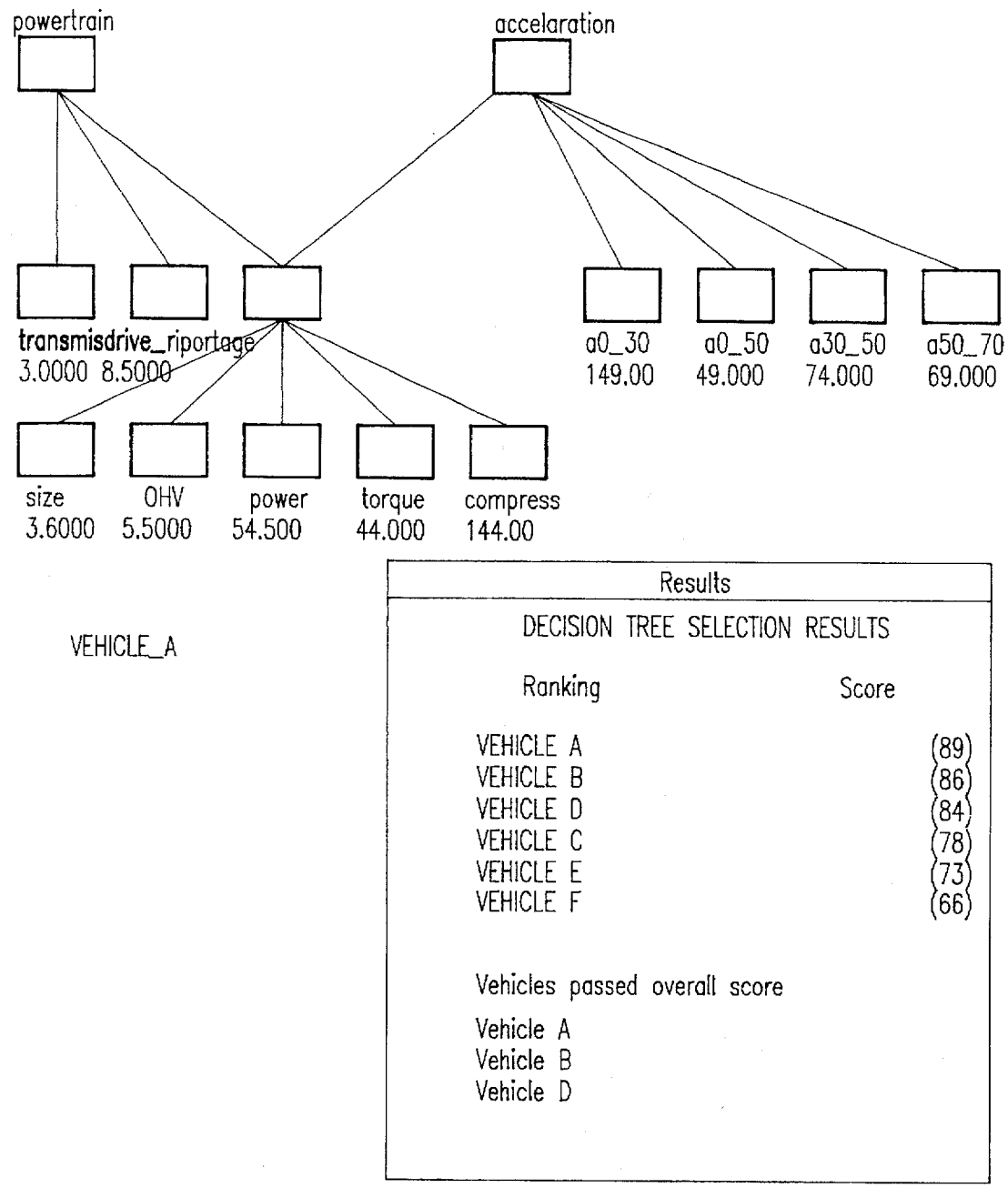
FIG. 13 shows an example of a decision tree in the optimization and decision support system module and the evaluation results of six alternative designs.

A sample set of decision trees in the first stage of alternative evaluation is shown in FIG. 13. In this case one of the second level variables is shared by two trees. The designer can scan through all the decision trees modeled in the ODSS and can make changes in the model through the GUIs for defining variable hierarchy. The sample results of an evaluation study is also shown in FIG. 13. In this case ODSS evaluated six different design alternatives against a set of designer specified criteria and ranked them in numerical order.

Stage 2: Conceptual Level Design Optimization

The second stage in VSDE consists of the optimization module for design-to-requirement tasks. If the designer has gone through the design evaluation process, he/she can pick one of the design alternative and optimize the design variables against a set of performance requirements. Otherwise, the designer can start with a crude set of design parameters and the decision model to obtain the optimized set of design parameters. As in the case of evaluation of alternatives, the optimization can be performed by splitting the whole process into different levels and optimizing each of them separately. While evaluation of prototypes is a forward chain operation, design optimization can be seen as a backward chain operation which is more goal-driven than data-driven.

Figure 14:
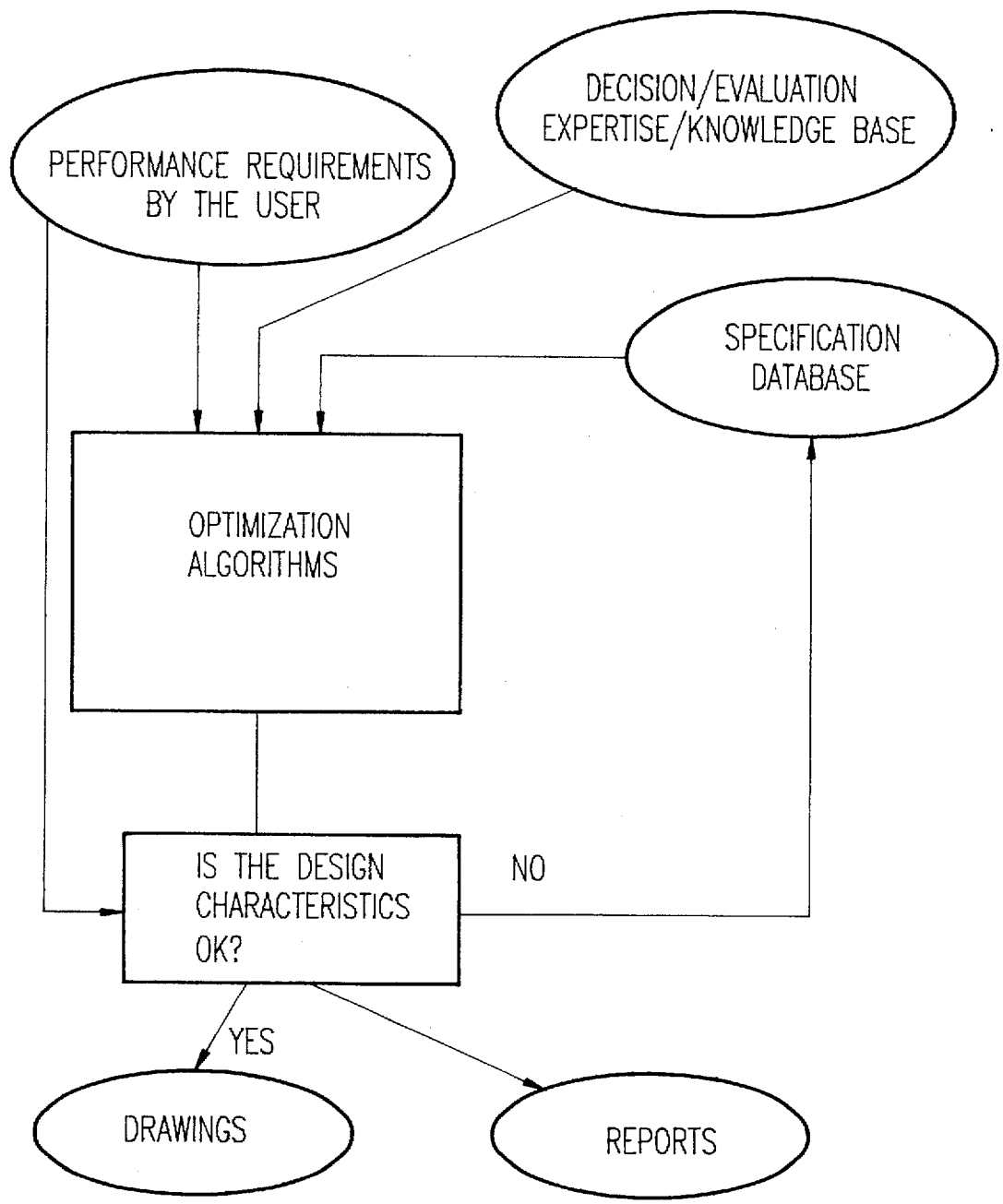
FIG. 14. is a functional flowchart for the optimization module.

The functional flow chart of the optimization process is shown in FIG. 14. The designer loads a decision model and specifies the performance requirements into the system, along with the specification database of the design to be optimized. As indicated before, the design can be one of the evaluated designs from the previous design stage or the database corresponding to a crude design. The specification database is iteratively modified using the optimization algorithms inside ODSS. ODSS has two optimization algorithms built in; one based on deterministic optimization principles and the other one based stochastic optimization principles.

One of the unique characteristics of the ODSS implementation is the translation of its knowledge base as a neural network architecture during the optimization process. This allows ODSS to use neural network optimization algorithms in the design process. Such an implementation also allows the ODSS to incorporate functional relationships, or models of subsystems into the high level system optimization process. Exact mathematical form of these models need not be known for the optimization process. These properties of ODSS and its use in subsequent system design stages is explained later on.

Another important characteristics of ODSS is the ability of its decision model to learn over design examples. Since the implementation of the KBS in ODSS is employed as a decision tree and algoritmically treated as a neural network, learning from previous designs will not be difficult to incorporate. This feature is not currently employed in ODSS, but will definitely an attractive property to add on at later stages of development.

Decision Trees and Neural Networks

Figure 15:
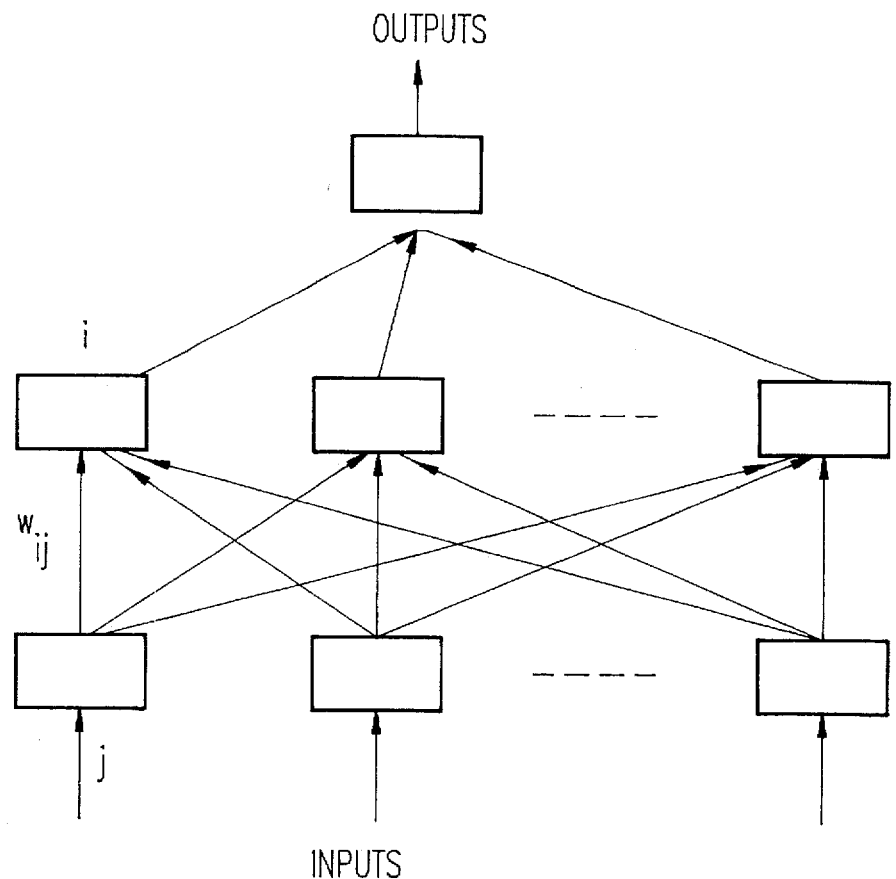
FIG. 15 shows the architecture of a feedforward neural network.

In ODSS, the architectural and operational similarities of neural networks and decision trees are exploited for the system optimization applications. FIG. 15 shows a feedforward neural network architecture with one layer of hidden neurons. In a typical feedforward neural network architecture, the nodes between two layers are fully interconnected. In the decision tree architectures used in ODSS, nodes in different sub-levels (FIG. 6) need not be fully interconnected; though in a complex decision model the number of interconnections may be high.

In some of the decision processes, all the decision trees need not be interconnected to all the other trees. In such cases, if the designer decided so, optimization of the individual decision trees and associated decision parameters can be done (when trees are interconnected, ODSS does not allow this option).

Deterministic Optimization Process

In ODSS an adapted form of bakpropagation algorithm (see Rumelhart, D., Hinton, G., and Williams, R., Learning internal representations by error propagation, in *Parallel Distributed Processing*, vol. 1., MIT Press, 1986) is used for the optimization process. Two different kinds of optimization are possible with the concepts set forth in ODSS. Either the optimization process can optimize the weights associated with each of the variables or it can optimize the value associated with each of the variables. In the first case, the decision model gets optimized and in the second case it is the input variables which are getting optimized. Only the second case is relevant for engineering design applications. But in applications where the decision model itself need to be optimized, the first characteristic of ODSS optimization will be useful. The designer can select this mode of optimization through the GUI.

Let $net_i$ denote the summed output of a node i. Then, $$net_i = \Sigma w_{ij} out_j$$

where $w_{ij}$ is the interconnection weight from node j of the lower layer to the node i and $out_j$ is the output of node j.

A sigmoidal transformation, f( ) to the summed output results in:

$$out_i = f(net_i) = \frac{1 - e^{-net_i}}{1 + e^{-net_i}}$$

When ODSS is used for decision model optimization, the updating equations for the interconnection strengths are expressed as:

$$W_{ij}(n+1) + W_{ij}(n) + \Delta W_{ij}(n+1)$$

where $$\Delta W_{ij}(n+1) = \eta \delta_{pi} O_{pj}$$

When ODSS is used for design parameter optimization, the updating equations for the input variables are expressed as:

$$O_{pj}(n+1) = O_{pj}(n) + \Delta W_{pj}(n+1)$$

where, $$\Delta O_{ij}(n+1) = \eta \delta_{pi} W_{ij}$$

where $$\delta_{pi}=(t_{pi}-O_{pi})f'(net_i)$$

for the output nodes and $$\delta_{pi}=f'(net_i)\Sigma\delta_{pk}W_{kj}$$

for any arbitrary hidden nodes

At each iteration, the parameters are updated as per the above set of equations.

Figure 16:
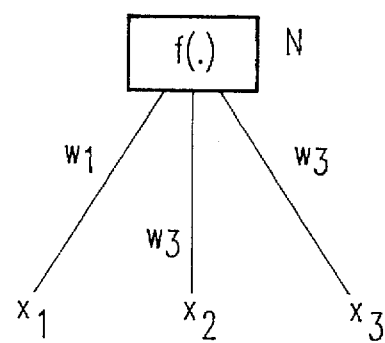
FIG. 16 shows the incorporation of nonlinear functions in a decision model.

One of the significant differences between the generally used neural network learning and the ODSS implementation is the ability of ODSS to incorporate any transformation function at the nodes. Nonlinear functions can be incorporated into the ODSS decision model by replacing the sigmoidal transformation function f(.) by the required one. For example, consider a node in the decision model represented in FIG. 16. In this case f(.) is a function of variables $x_1$, $x_2$, and $x_3$. $x_1$, $x_2$, and $x_3$ can be the input design parameters, in which case node N is in the input layer, or they can be the outputs of other nodes in the lower layer.

The second distinguishing property of the ODSS implementation of the optimization process compared to the Nonlinear Programming (NLP) approaches is that in ODSS, the exact functional form of f(.) need not be known for the overall optimization process. If the deterministic optimization process is used, the only requirement about function f(.) is that its derivative should exist and should be known. In cases where f(.) and its derivative are unknown, the designer can choose the stochastic optimization process in ODSS through the Graphical User Interface.

Stochastic Optimization Process

The second optimization algorithm implemented in ODSS is called Alopex (see Unnikrishnan, K. P., and Venugopal, K. P., Alopex: a correlation based learning algorithm for feedforward and recurrent neural networks, *Neural Computation*, vol. 6, 1994, pp. 469–490). Alopex is a simple, but powerful, stochastic optimization algorithm. The algorithm works by broadcasting a measure of the global performance, to all the nodes in the decision model, synchronously. The explicit derivative of the effort function need not be calculated for updating the parameters. A correlation measure between the change in weight and the global error change is estimated and the individual parameters are changed based on a probability index of going in the right direction of optimization, so that the global error function is minimized.

Consider a node i with an interconnection strength $w_{ij}$, from neuron j in the lower layer. The output of the node i, during the $n^{th}$ iteration, is given by:

$$net_i(n)=\Sigma W_{ij}(n)out_j(n)$$

Applying a transformation f(.) to this results in $$out_i(n)=f(net_i(n))$$

During the $n^{th}$ iteration, output $out_i$ is updated as, $$out_i(n)=out_i(n-1)+\delta_i(n)$$

where $\delta_i(n)$ will have a small positive or negative step of size $\delta$ with the following probabilities:

$$\begin{aligned}\delta_i(n) &= -\delta \text{ with probability } P_i(n)\\ &= +\delta \text{ with probability } (1-P_i(n))\end{aligned}$$

The probability $P_i(n)$ is given by the expression:

$$P_i(n)=\frac{1}{1+\exp(-\Delta_i(n)/T)}$$

where $\Delta_i(n)$ is given by the correlation:

$$\Delta_i(n)=\Delta out_i(n)\Delta E(n)$$

$\Delta out_i(n)$ and $\Delta E(n)$ are the changes in the weight $out_i$ and the error measure E over the previous two iterations (for the first two iterations, $P_i(n)$ is taken as 0.5). In the expression for $P_i(n)$, T is a positive temperature that determines the effective randomness in the system. With a non-zero value for T, the algorithm takes biased random walks in the direction of decreasing E. The optimization process starts with a large value for the temperature T.

Stopping Criteria for the Optimization Process

In ODSS, the designer can specify the number of iterations (in GUI) through which the optimization process need to be continued or the error tolerance allowed in performance objectives. ODSS monitors the effort between the desired performance requirements specified by the designer and the system performance, and if this is less than the tolerance specified, the optimization process is stopped. Error tolerance based stopping overrides iteration based stopping. Iteration based stopping is necessary, since in some cases the designer may be putting unattainable performance specifications and there may not be a system designable for those specifications. In these cases, ODSS stops the optimization process based on the number of iterations specified by the designer.

Graphical User Interfaces Corresponding to the Optimization Process

Figure 17:
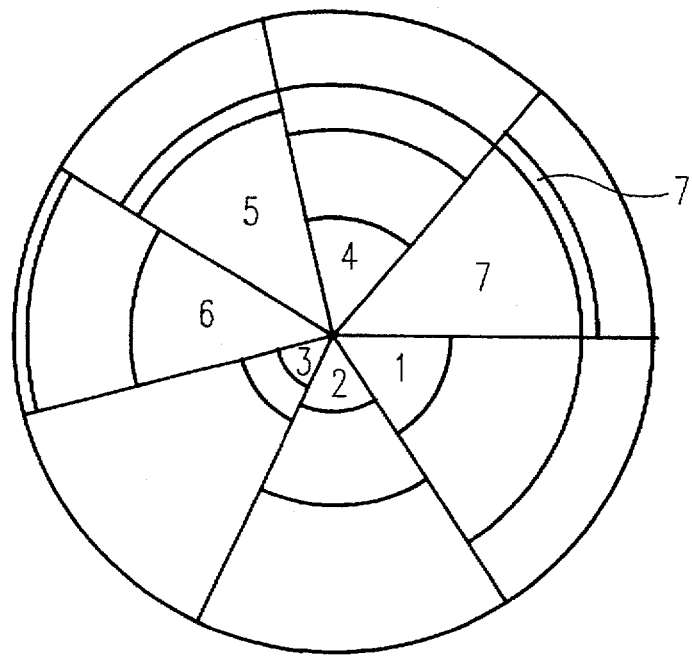
FIG. 17 shows an example of a graphical result of an optimization process.

The designer lists the performance specifications in the objectives text edit window on the front end GUI. If the optimization process is preceded by the evaluation of the alternatives, the designer can choose one of the alternative designs for optimization. The selection of stopping criteria and the choosing of the optimization algorithm (deterministic or stochastic) are also done through the front end GUI. The designer can observe the optimization process through windows and visualize the optimized system characteristics through the results window. FIG. 17 shows an example of the results display.

Sensitivity Analysis

The sensitivity of each of the variables in the decision model to the changes in system specifications can be easily calculated and displayed in ODSS. The designer can choose one of the input variables and find its effect on the overall performance requirements or any intermediate level decision model nodes, fixing all the other input variable values. The results are displayed on a graphics window in ODSS.

Stage 3: Detailed Design

Figure 18:
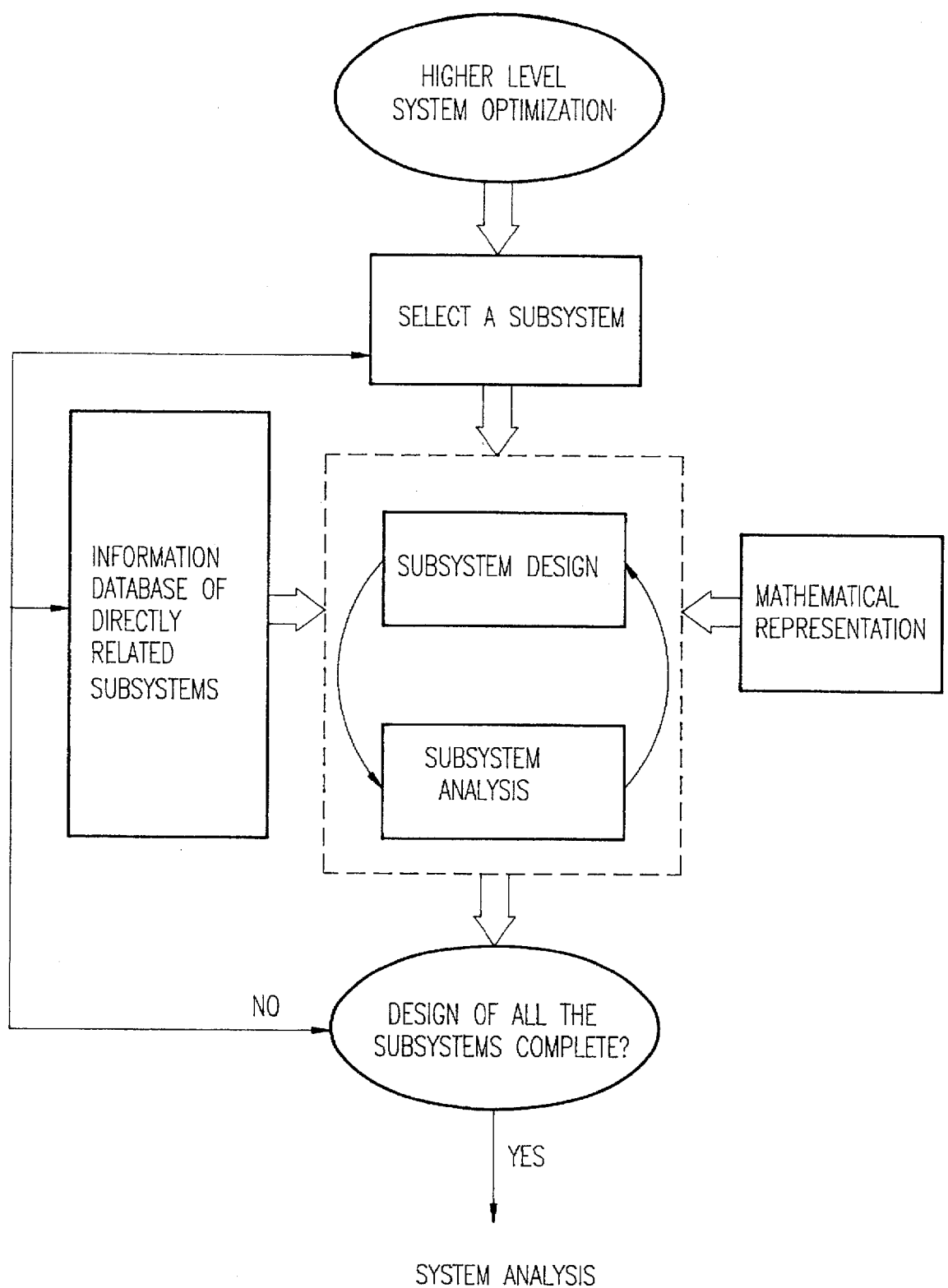
FIG. 18 is a functional flowchart of the virtual system design environment detailed design stage.

The third stage in VSDE consists of the Detailed Design stage. This is a part of the Design Environment (DE). In this stage, subsystems and components of the system are designed and integrated into VSDE. FIG. 18 shows the functional flow graph of the detailed design stage. The designer has the flexibility to design some of the components inside VSDE itself or it can import externally designed components into it for integration. For internal design, the exact mathematical equations representing the subsystem being designed need to be known.

In VSDE, two different design and integration are possible; geometry based design and function based design. The modes of design can be chosen by the designer depending on the application in hand. In the geometry based design, the subsystem property of interest is the geometrical characteristics. The subsystems may be represented as 2D or 3D CAD models and the design environment allows the designer to virtually integrate the components into subsystems, and the subsystems into the overall system.

In the function based design, the property of importance is the functionalities of the subsystem and its components. This mode of operation in VSDE allows the designer to easily integrate subsystems such as electrical power supply, control systems, suspension etc. into the design environment. In this case the integration is based on the function models or mathematical equations representing the subsystems or its components.

In both the modes of operation, each of the subsystems are associated with a Subsystem Hierarchy Graph (SHG) and a Subsystem Information Database (SIDB). The Subsystem Hierarchy Graph dictates the hierarchy of subsystems and any changes in subsystems, components and their integration need to be reflected through SHG. SIDB keeps a record of the inter-relationships with other subsystems and associated constraints. At any time during the design process, the designer can change the information database, subsystem models or functionalities and do the studies based on the new set of subsystems and functionalities. Also, the designer can study the effect of changes in each of the subsystems on the overall performance characteristics he/she has specified in ODSS during the Stage 1 or Stage 2 operation.

System Hierarchy Graph

Figures 19, 20:
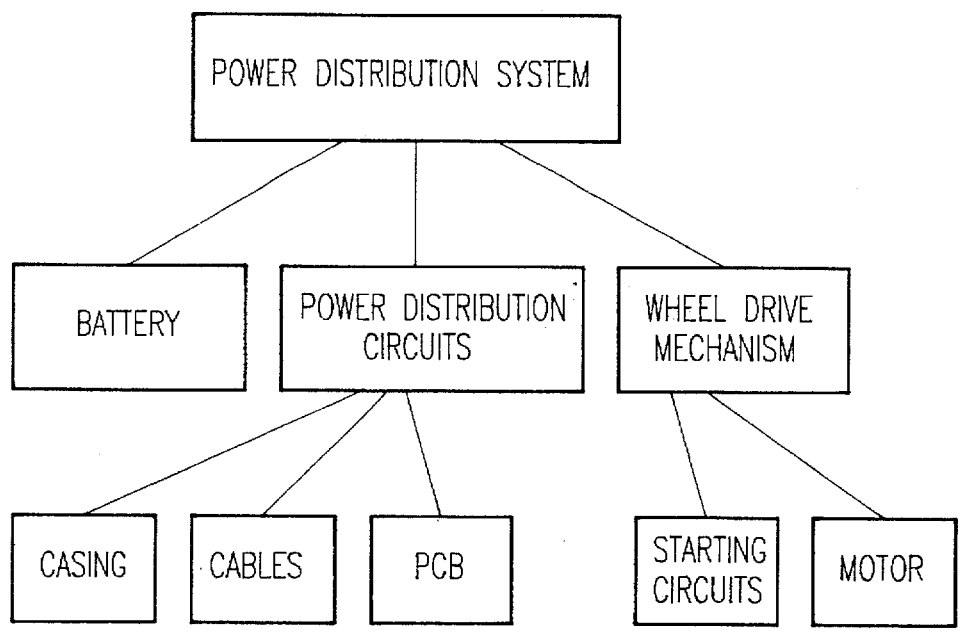
FIG. 19 is a sample system hierarchical graph.
FIG. 20 is a sample subsystem information database of the system hierarchical graph.

During the detailed design stage, the subsystems and components of the subsystems are represented by the SHG. Each of the subsystems and its components are represented in a hierarchy with each link representing the breakdown of the corresponding entity. Each rectangle in SHG corresponds to an entity and each of the rectangles connected to it from the lower level corresponds to the primitive entities associated with it. For example, an entity car can have engine, chassis, wheels etc. as the primitives and at the next lower level engine may be having primitives such as casing, spark plugs, fuel injection module, and valves. FIG. 19 shows a simple SHG of a power distribution system represented as a three level hierarchy. The user can define more levels in the hierarchy primitives for each of the entities, depending on the refinement in the model needed.

Subsystem Information Database

The Subsystem Information Database (SIDB) consists of a connection matrix relating the subsystems and components themselves. For example, let Power Distribution Circuits (PDC) module in FIG. 21 have a direct correspondence with the module Battery. The correspondence means, for effective functioning of PDC, Battery is a must and vice versa. Note that in the SHG this information is not reflected as inter-relationships between modules in the same level. SIDB helps in simulating the overall system by collectively considering the subsystems and their interrelationships. When VSDE is used for evaluating technology changes in subsystems and components, such a database is essential. Technological advances in one of the subsystems need not translate to an overall improvement on the systems, unless advances of same magnitude have happened with the other related subsystems and components.

For the example hierarchy in FIG. 19, the SIDB for the middle level will be of the form shown in FIG. 20. Here, the entry (Battery, Wheel Drive) relates the importance of Battery for the function of Wheel Drive, and the entry (Wheel Drive Power Distribution Circuit) relates the importance of Wheel Drive for the function of Power Distribution Circuit. Note that the matrix need not be symmetrical, since the relationships between subsystems or relationships between components need not be symmetrical. For example, (Battery, Wheel Drive) relationship may be High, while (Wheel Drive, Battery) relationship need not be High.

The SIDB in the case of geometrical design and functional design will be different. In the case of geometrical design, SIDB contains information about the physical linking of subsystems and components. Hence the SIDB matrix in this case will not be having fuzzy entries such as Medium, Low etc. The relationships will be expressed as yes or no, with the yes value indicated by a 1 and a no value indicated by a 0. Also in geometrical design, the SIDB matrix will be symmetrical.

Figure 21:
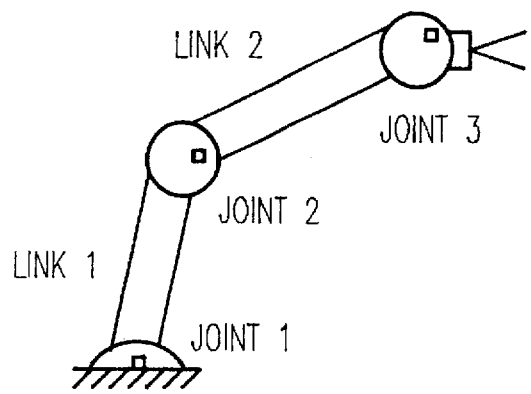
FIG. 21 illustrate a robot arm having two links and three joints.
Figure 22:
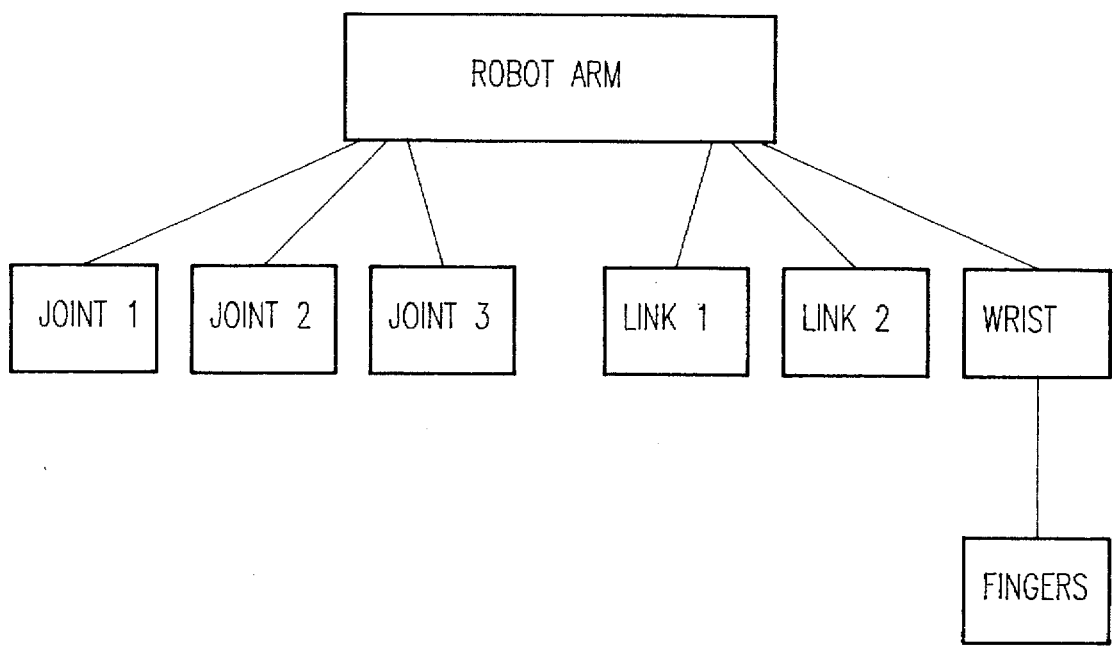
FIG. 22 illustrates a system hierarchical graph of the robot arm shown in FIG. 21.
Figures 23, 24A, 24B:
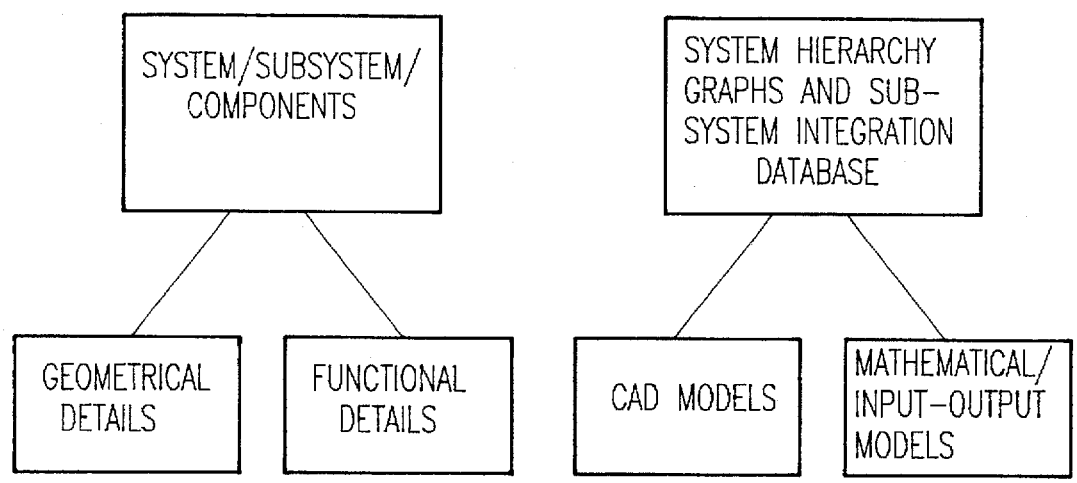
FIG. 23 shows the subsystem information database corresponding to the system hierarchy graph shown in FIG. 22.
FIGS. 24(a) and 24(b) are representations of the hierarchical relationship in the subsystems and components, FIG. 24(a) being the two design and analysis path supported by the virtual system design environment, and FIG. 24(b) being an internal representation of the system subsystem designs.

An example of SIDB in the case of geometry based design is given below. FIG. 21 shows a robot arm with two links, three joints and a set of fingers. The SHG for this system will be of the form as shown in FIG. 22. SIDB plays an important role in applications like this. In this case SHG does not convey information about the arrangement of the links; whether link 1 and link 2 are connected through joint 1 or joint 2; or whether the wrist is connected to joint 3 or joint 2 etc. A typical SIDB for this design problem is shown in FIG. 23. The matrix elements are 1, if the corresponding (row, column) combination is physically connected and 0, if not.

In both these examples, the SIDB is represented as a matrix with the relationships between two entities represented as a single variable or numerical value. In the present implementation, this is done employing an array. More sophisticated implementation of SIDB may be needed to deal with more complex problems. In such cases each of the relationships may be represented by a multiple element data structure.

Geometry Based Design and Functional Design

VSDE allows two types of system design and analysis, geometry based design and functional design. In geometry based design, the physical characteristics of the system is taken into consideration. It is similar to a typical top-down design approach. The physical characteristics include size and shape. In this case, the subsystems are the physically separable components of the system. The system can be represented as a 3D structure or 2D structure and VSDE allows incorporation externally designed components of these structures. The objective in this case is to evaluate the integration of subsystems and their components and visualize them graphically. The subsystems are of the form of CAD models.

In functional design, the functional integrity of the system and its subsystems are simulated and evaluated. VSDE supports mathematical representation or input/output mapping of the subsystem functionality. The input/output mapping can be of the form of a black box inside which the mapping is represented as a neural network, fuzzy logic system or knowledge based representation. All the subsystems and components need not be modeled using the same modeling technique. Some of the subsystems can be represented mathematically, some of them represented as neural network models or some others as knowledge based systems. This characteristics of VSDE is very useful in system integration studies because, in many cases subsystems may not be designed by a single agency and some of the subsystems may be off-the-shelf products.

In both geometry based design as well as functional design, SHG and SIDB defines the system structure and interdependencies (FIG. 24). The geometric details as well as functional details of a design are two parallel aspects of SHG and SIDB (FIG. 26a). At any time the designer can view and edit the geometric details or functional details using corresponding design browsers. The design browsers are called Geometry Design Browsers (GDB) and Function Design Browsers (FDB). For making any changes in these browsers, the designer need to make corresponding changes in SHG and SIDB.

Geometry Design Browsers

Figure 25:
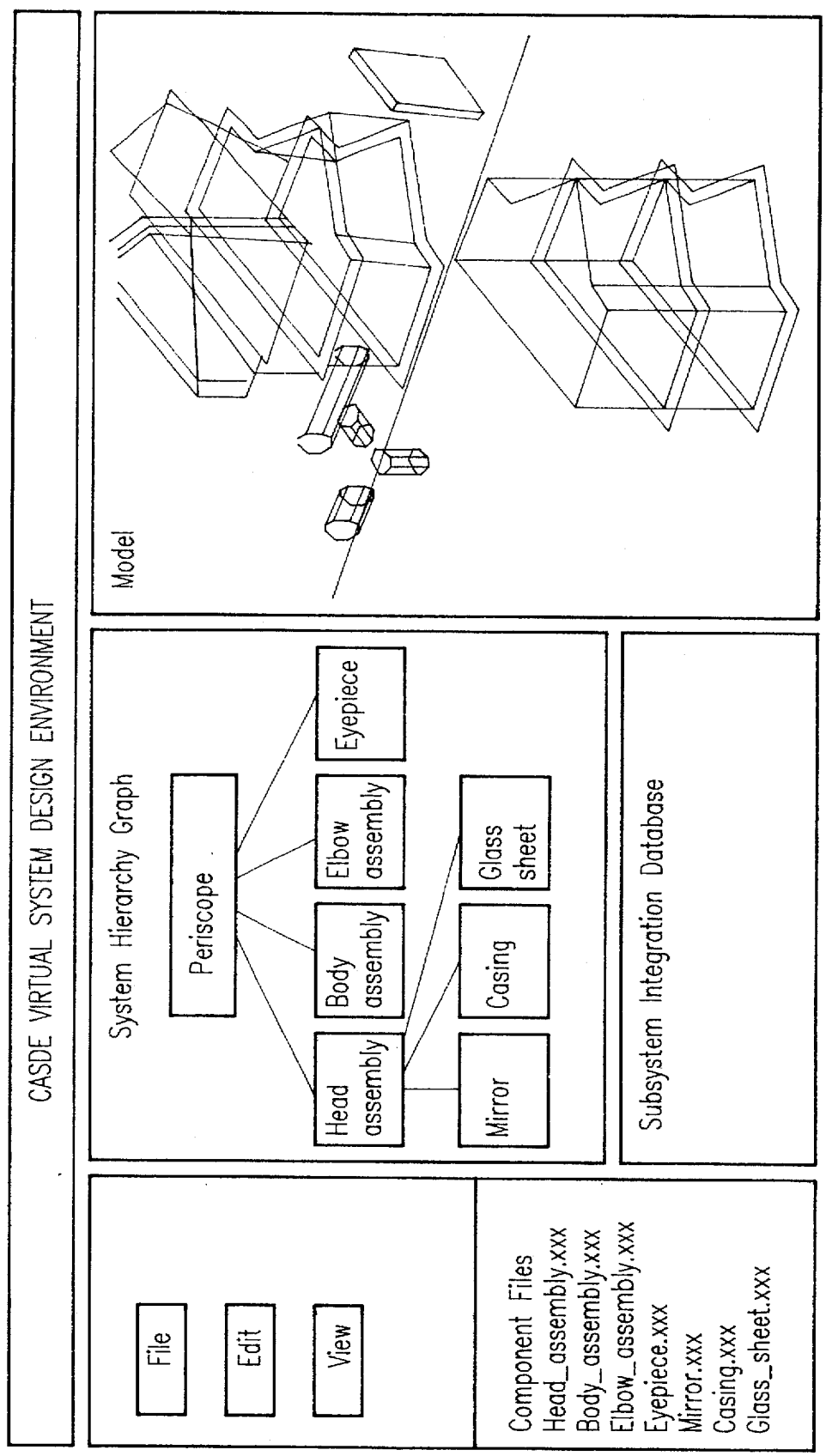
FIG. 25 is an illustration shown the example of an interface of the geometric design browser.
Figure 26:
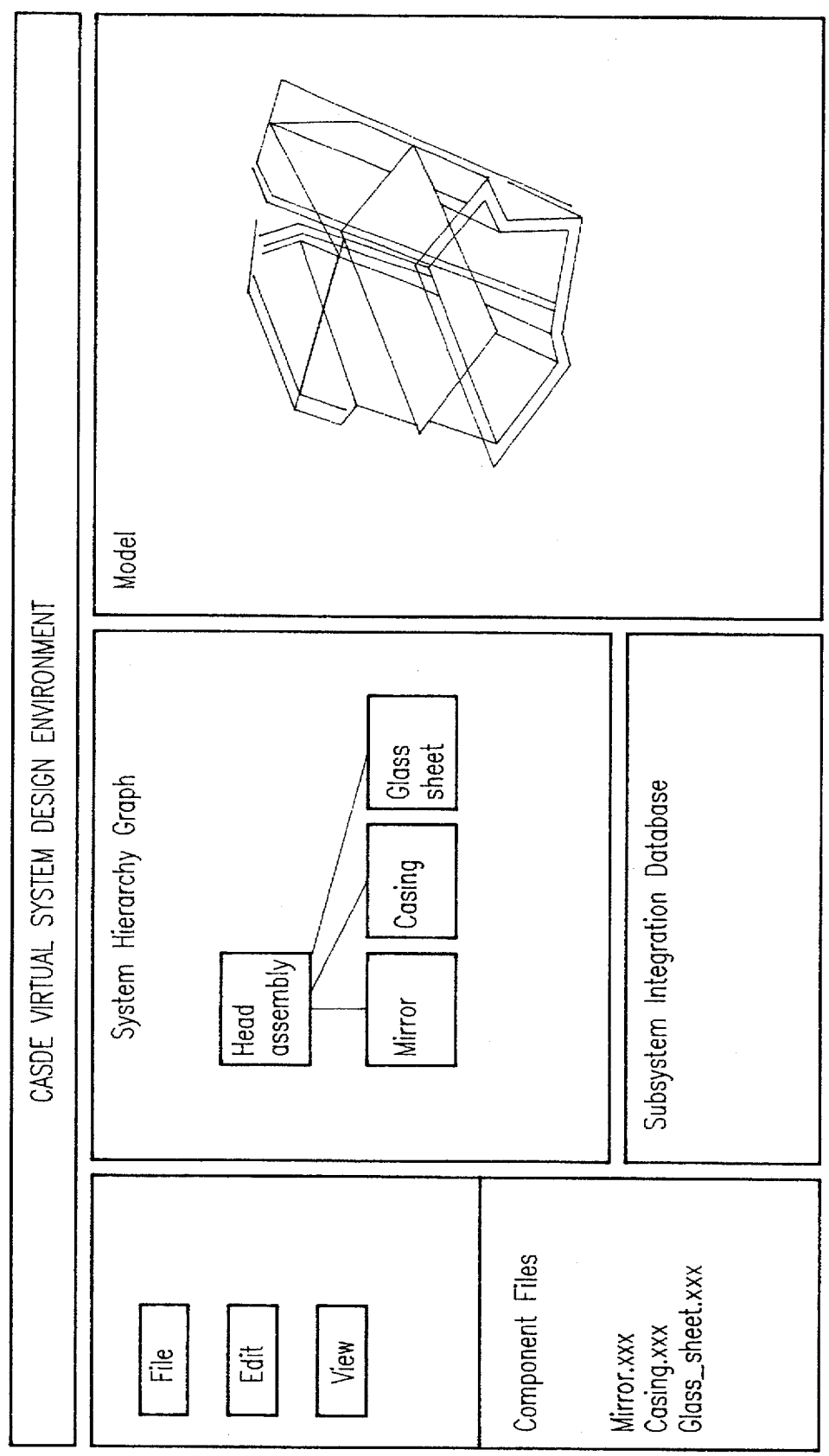
FIG. 26 shows the selection of one of the subassemblies and corresponding geometric models.

The Geometry Design Browser (GDB) is an interactive editor that provides access to each individual components of a system. The designer can edit the SHG and SIDB also in GDB. FIG. 25 shows an example user interface for GDB. It has three display windows and two panel windows. The designer can choose one of the three display windows for editing. For example, he/she can choose the Model Window and select any of the subsystems or components and arrange them anyway he/she decides. Corresponding changes are made on the SHG and SIDB windows so that the overall system is consistent with the hierarchy. Each of the subsystems have an associated CAD model and the designer can select any one of these subsystems and edit its hierarchy and components. For example, FIG. 26 shows the interface when the designer has selected the Head Assembly subsystem. In this interface only the selected subsystem and its components will be displayed and can be edited.

Thus the designer can scan through each of the levels in the hierarchy or each of the subsystems in each of the hierarchy levels and do detailed design studies. If any of the geometric details of the subsystems are not acceptable, the designer will be able to redesign that subsystem and virtually reintegrate the whole system again.

The GDB can incorporate 2D or 3D models of the subsystems. In the case of 3D models, the designer can select any perspective view of the design by specifying the look angle.

Implementation

The GDB is implemented in an Object Oriented environment. Each of the subsystems and their components are treated as an object. Depending on the hierarchy specified in SHG and relationships specified in SIDB, some of these objects will be inheriting characteristics from their parent objects. The model rendering and associated graphics manipulations are done through World Toolkit Libraries.

Function Design Browsers

Figure 27:
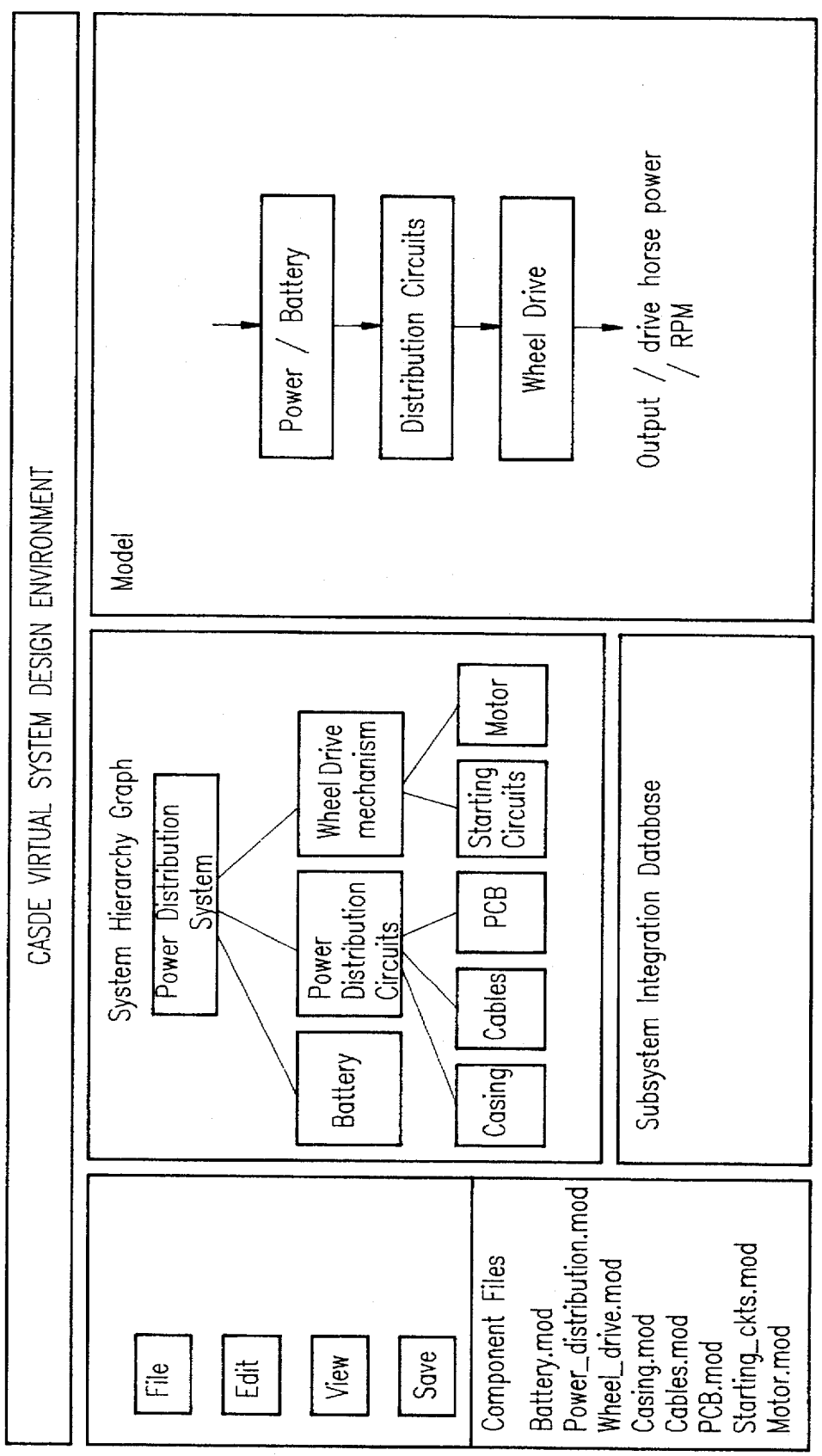
FIG. 27 is an example interface of a functional design browser.

Like GDB, Function Design Browser (FDB) is an interactive editor which allows the designer to design and integrate system functionalities. The underlying subsystem relationships are represented by the SHG and the SIDB. FIG. 27 shows an example FDB for the system shown in FIG. 19. As in the case of GDB, FDB also has three display windows and two panel widows. The first difference between GDB and FDB is in the model window. In the case of functional design, in this window the system functionalities are represented with all the interrelationships. The second difference is that dynamic simulation of the functionalities is possible in FDB. Such a feature is not currently incorporated in GDB.

Each of the subsystems are represented mathematically or through input/output models. VSDE supports three different kinds of models; neural network representation, fuzzy logic systems and knowledge based system models. The design environment is flexible enough to support a combination of all the three models and mathematical representation together. This is a unique property of VSDE.

Since the subsystems need not be designed inside VSDE, the designer may not be having control over the representative format of some of the subsystems. Some of the subsystems may be off-the-shelf products. The design environment supports integration of such hybrid subsystems and their evaluation. Also, this property of VSDE is essential when it is used as a technology evaluation tool. The technological advancements in subsystems may be difficult to be predicted and the system evaluation tool should be able to integrate and study subsystems from different domains.

Figure 28:
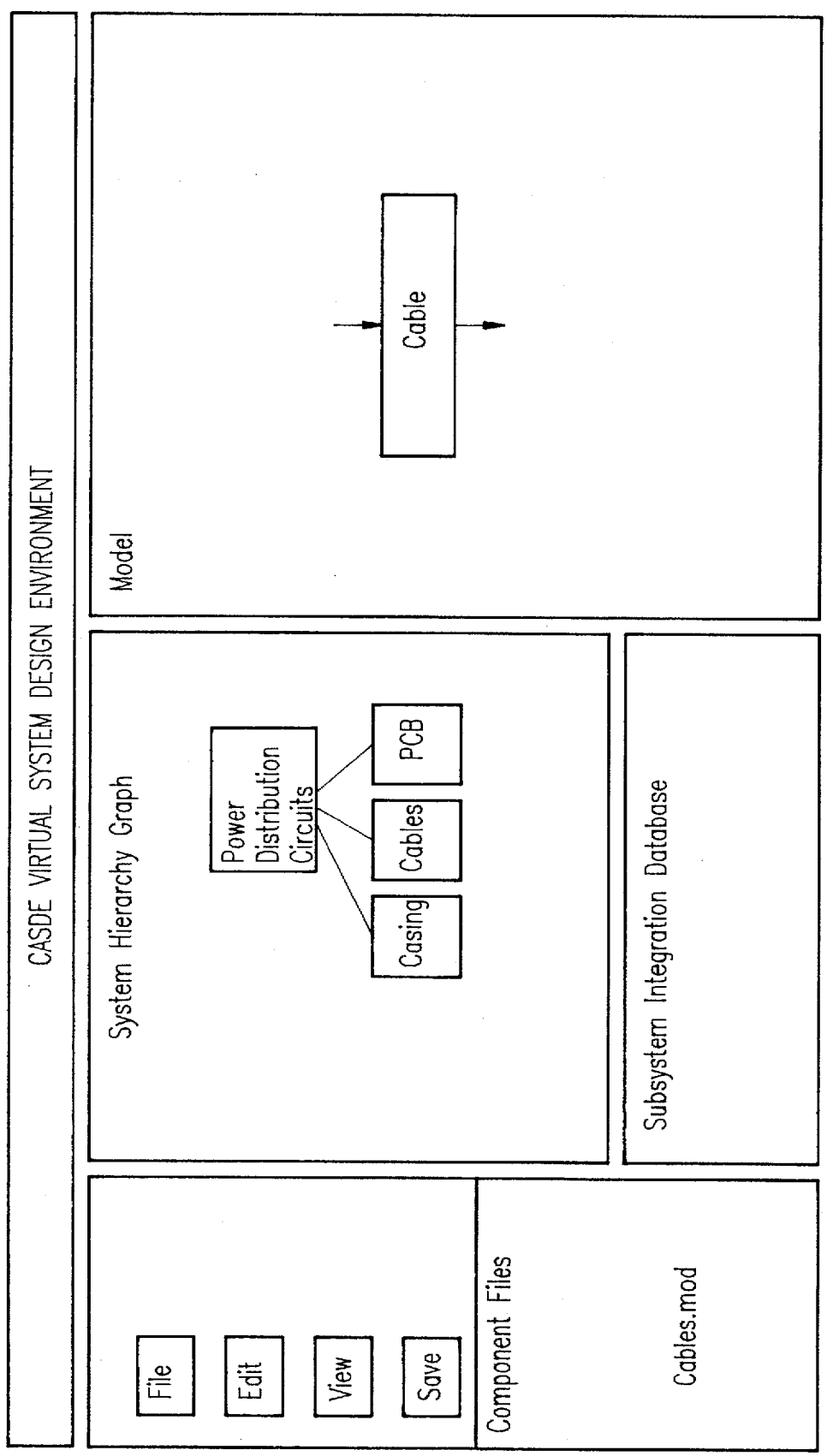
FIG. 28 shows the selection of one of the subassemblies and corresponding functional models.

Some of the subsystems which has only geometrical properties associated with them, will not be showing up on the functional design browsers. For example, in Power Distribution Circuits subassembly, the components Casing and PCB may be having only geometrical properties associated with it (unless, Casing is used for heat dissipation, grounding etc., or electrical resistance of PCB circuits is relevant; in which case they have electrical functions associated with it). If the designer chose to examine this subsystem, the FDB will look like the one in FIG. 28.

Unlike GDB, implementation of FDB does not require sophisticated graphics manipulation libraries or display routines. The important software components of FDB are the Input Data Interface, Sub-System Model, and Output Data Interface. The designer has to specify the type of modeling employed (mathematical representation, neural networks etc.) so that the browser can make necessary changes in the data interfacing. During the simulation stage, the designer can monitor the input data, output data and any data flow at any intermediate point of interest, specified through the user interface.

FDB allows two modes of operation; an off-line mode and an on-line mode. In off-line mode, the input data is provided from a file and the output data as well as the specified intermediate results, are stored as data files. These data files can be visualized as graphs or charts later on. In the case of on-line mode the designer can visualize the results at the output and intermediate points through on-line visualization windows.

Implementation of Geometric and Function Design Browsers

The Design Browsers are implemented in an Object Oriented environment with C++/Java as the programming environment. The user interfaces are developed in X/Visual C++.

Stage 4: Detailed System Analysis

Figure 29:
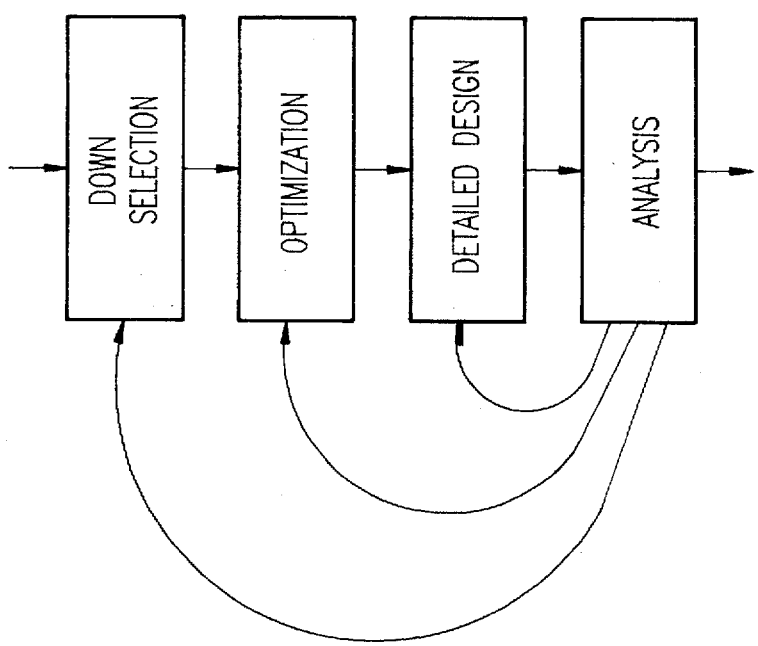
FIG. 29 illustrates design modification under the virtual system design environment.

The final stage in VSDE is the analysis of the overall system. In Stage 3, VSDE allows the designer to design and integrate the subsystems and the components of subsystems. Stage 3 does not allow the designer to analyze the whole system with respect to the objectives and constraints set forth in Stages 1 and 2. This feature in integrated in Stage 4 of VSDE. Since all the design stages are integrated, the designer can go back to any of the earlier design stages and make changes to the subsystems, components, performance characteristics or design goals and re-evaluate the entire system. This feature of VSDE is extremely useful in applications involving design process consisting of many iterative steps. Also, the entire system or any of its subsystems can be simulated structurally as well as functionally during this design process and the design parameters can be optimized. The representation of such a stages approach in VSDE is illustrated in FIG. 29. Note that the Stages 1 and 2 can have multiple substages in each of them (FIG. 3) and VSDE allows the designer to go back to any of these substages during the Stage 4 analysis.

Figure 30:
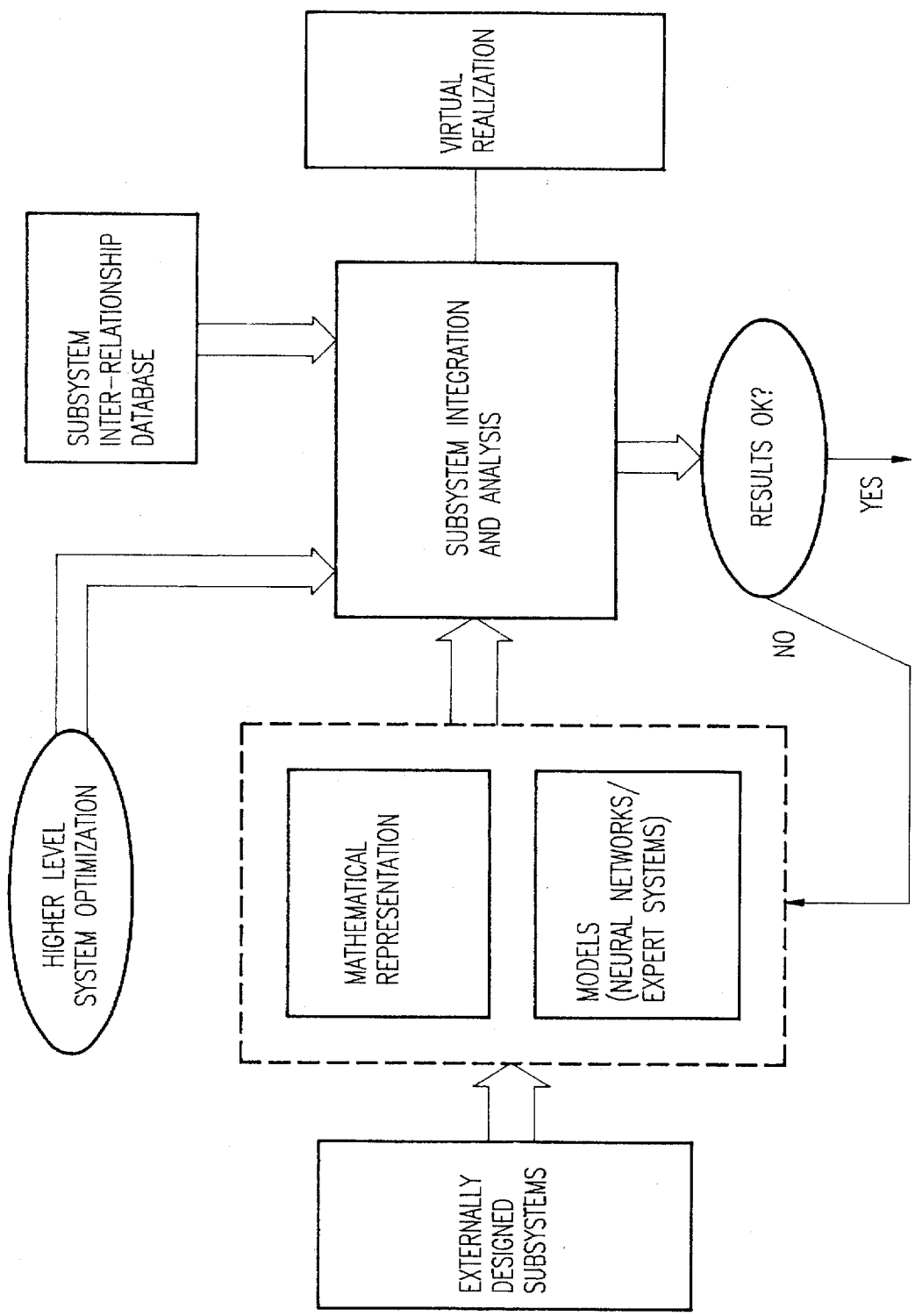
FIG. 30 is a functional flowchart of the virtual system design environment detailed system analysis stage.

The functional flow chart of Stage 4 is shown in FIG. 30. As in the case of the previous stage, analysis can be done based on geometry or functionalities. The characteristics of the system, subsystem and their components form the inputs to the ODSS and for the designed system the designer can check whether the top level objectives are met. The number of system characteristics needed for the evaluation depends on the ODSS model complexity. In some cases, the ODSS model may be incorporating inputs from the subsystem levels too. Also, all the inputs to the ODSS need not be the results of detailed design. Some of the inputs to ODSS may be from external sources.

Figure 31:
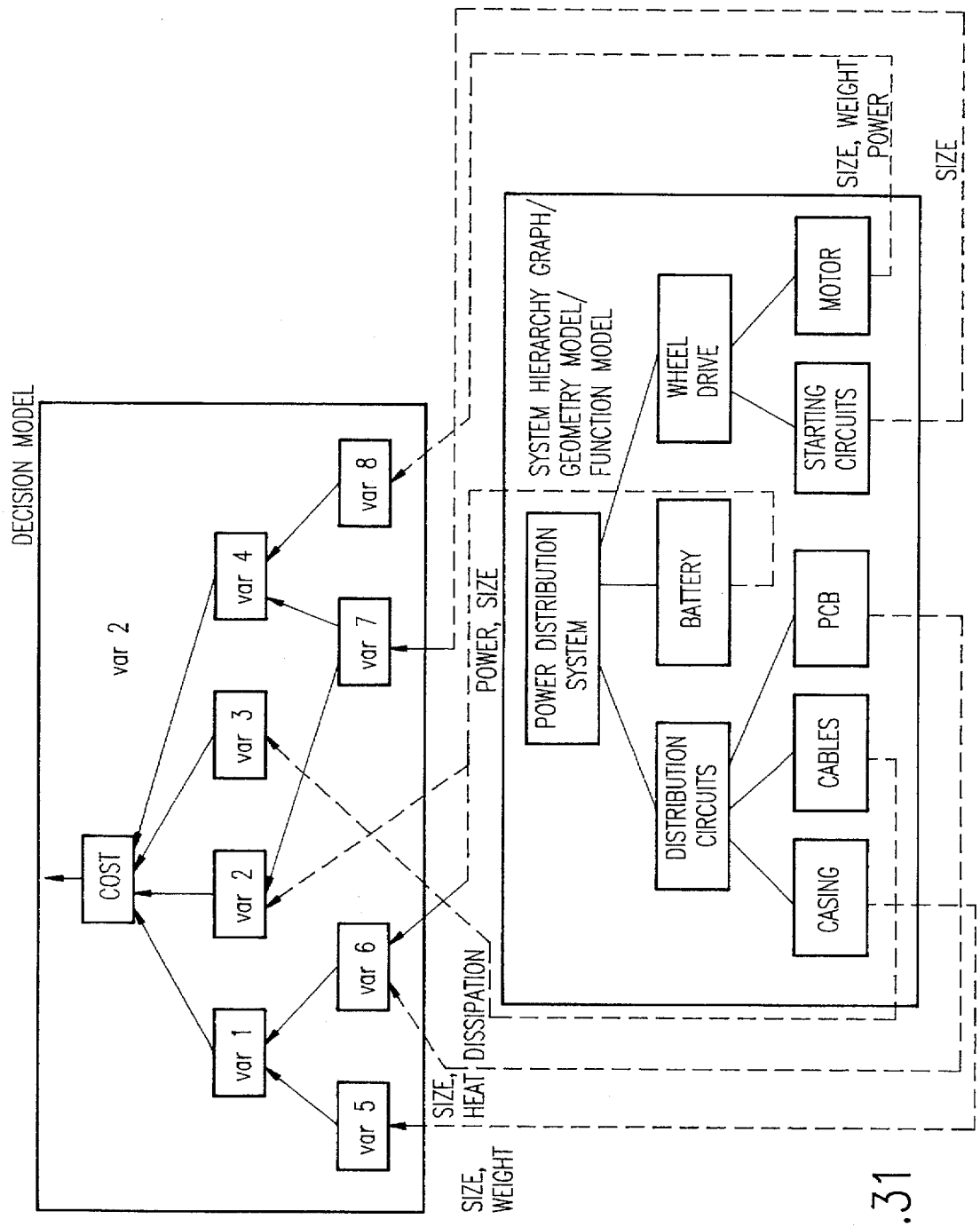
FIG. 31 illustrates the interaction between the detailed system design stage and conceptual design stage during the detailed system analysis operation.

The above aspect of VSDE is explained in FIG. 31. Consider the example of Power Distribution System design (FIG. 21). Let Cost of the system is the higher level variable of most concern. During Stage 1 and 2 of the design process, the designer would have made a decision model (as decision trees) representing the higher level variables (FIGS. 6 & 13), including Cost. If Cost is the only variable of concern, there will be only one top most level node in the ODSS model. The inputs to the model will be design parameters such as size of battery, weight of battery, motor power, motor size etc., which are the parameters decided during the detailed design phase in Stage 3. The ODSS model can also have external inputs such as cost of assembly, shipment cost/lb. etc. which are not design parameters.

During the functional or geometric design stage, each of the nodes in the functional hierarchy or geometric hierarchy will be associated with more than one design parameters. For example, the node Motor may be associated with size, weight and power; the node Casing may be associated with size and weight. The number of design parameters associated with a node depends up on the refinement of the functional or geometric models. The node Motor by itself can represent a model hierarchy consisting of subnodes such as weight, size and power. It is up to the designer to decide how refined the model should be and the design environment imposes no restriction on the complexity of the models being built or the design tasks being considered. As indicated before, such a hierarchical representation of subsystems and components, and their implementation based on Object Oriented principles provide VSDE considerable flexibility in modeling and power on the overall design process.

Model Dependency Matrix

The interconnections of design parameters-to the ODSS models are defined through a Model Dependency Matrix (MDM). The MDM is similar to the SIDB in Stage 3, except that each of the elements in MDM may be associated with a submatrix. This submatrix defines the interconnections of subnodes associated with that node. Such submatrices will exist only when multiple attributes are associated with the nodes in design hierarchy. For example, FIG. 32 shows the MDM for the example shown in FIG. 30. The elements (Motor, var 8), (Battery, var 6), (Battery, var 2), (PCB, var 6) and (Casing, var 5) have submatrices associated with them. FIG. 33 shows some of those submatrices.

Implementation

Following the detailed design, the designer can analyze the designed system against each of the conceptual level objectives (specified in ODSS, during Stage 1 and 2). The designed system need not be the same as the ODSS optimized system because of geometrical or functional limitations of the subsystems and components. Some of these limitations may be surfacing only during the detailed design phase.

Figure 34:
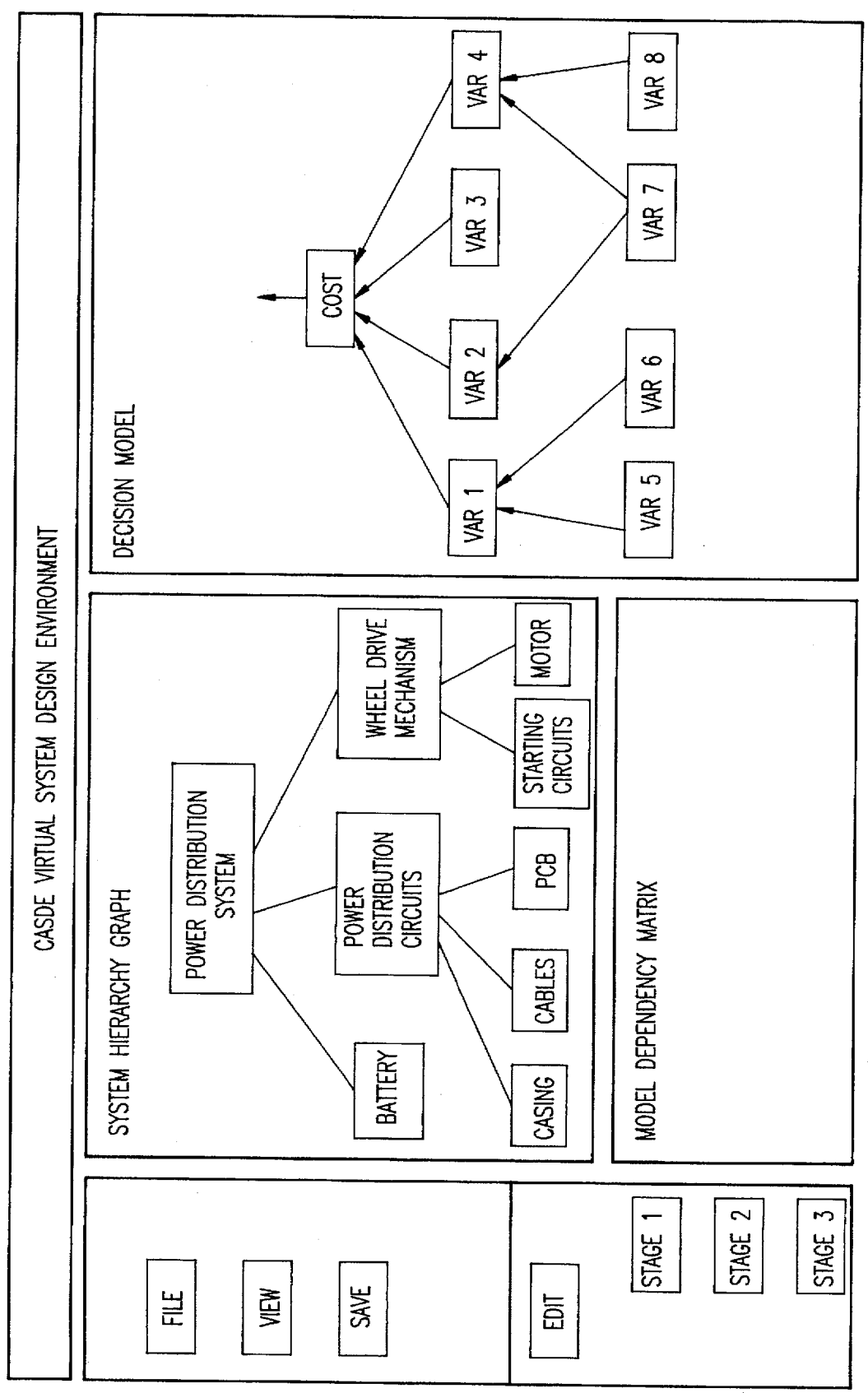
FIG. 34 shows an example interface of the system analysis stage.

The VSDE user interface for Stage 4 allows the designer to go back to the ODSS knowledge based model and decision trees and change the hierarchy or variables, or change the operations in detailed design stage (Stage 3). FIG. 34 shows an example user interface for Stage 4. As in Stage 3, this interface also has three display windows and two panel windows. The display windows show the SHG/Function Mode/Geometric Model, the decision model used in ODSS and the Model Dependency Matrix. Clicking on the SHG/Model window allows the designer to go back to Stage 3, for the detailed design process. Clicking on the ODSS decision model allows the designer to change the decision model, and clicking on the MDM window allows changing of the MDM matrix. Consistency of the changes is checked each time a change has happened and the information contained in all the three display windows need to be consistent with each other.

What is claimed:

1. A computer-implemented prototyping method comprising the steps of:

identifying and selecting a design from a collection of alternate designs which best satisfies a set of conceptual level design specifications;

optimizing characteristics of the design based on the conceptual level design specifications;

modifying the specifications interactively using graphical interfaces for reevaluating and re-optimizing the designs;

simulating the functional and geometrical properties of the design and components of the design on a computer using graphical design browsers;

analyzing a performance of the design against a set of design specifications and effecting a redesign by interactively selecting one of the previous design operations through the graphical user interfaces;

wherein said identifying step includes:

using a knowledge base system including a user modifiable artificial intelligence based representation of a decision tree defined by an interconnected multi-level nodal hierarchy having a strength assigned to each of the interconnections between nodes in the hierarchy;

using a database including a stored database representation of the functional details of the design alternatives under consideration by the user, the database representation being consistent with the multi-level nodal hierarchy of the knowledge based system;

using a constraint solver implemented as a set of logic programs which evaluates the user specified constraints on the nodal variables in the nodal hierarchy against the functional details of the design alternatives represented in the database and computed nodal strengths during an evaluation process;

using a graphical user interface including a first edit window for designing, displaying and revising the decision tree in response to user input commands through a computer keyboard and mouse; and a second edit window for displaying the database representation and revising the database representation in response to user input commands; and a third edit window for displaying and revising the specifications against which the design are evaluated in response to user input commands; and further including a set of graphics panels for displaying intermediate and final results of the evaluation process;

wherein the said optimization step includes:

using a neural network based representation of the nodal hierarchy with the interconnection strengths of the hierarchy implemented as weights in the neural networks and the user specifications represented as an objective function at the output layer of the neural network, and the input variables corresponding to the functional details of the design being optimized stored in the database;

using another graphical user interface including a front end for the user to specify the number of cycles through which the optimization is performed, and yet another graphical interface for specifying whether the optimization is performed on a single design or on a set of designs, and a set of colored graphics panels for displaying the intermediate and final results of the optimization, and another graphical interface to allow the user to revise design specifications and re-optimize the designs.

2. A method according to claim 1, wherein said simulation step includes:

solving a set of mathematical equations representing the functional behavior of the components, implemented using software programs residing in the computer memory, for design of components of the design;

incorporating components designed externally, without the help of software programs mentioned above, into the computer memory;

specifying the interrelationships of design components in terms of their functional properties as well as geometrical properties employing a set of matrix based databases and hierarchy graphs defined by a multi-level nodal hierarchy having each of the nodes representing a component of the design;

browsing the functionality and geometry of the design using a set of graphical interfaces in which the designs, its functional hierarchy, and its geometrical hierarchy are displayed; in which the user can select any one of the components shown on the display and examine or revise corresponding hierarchy.

3. A computer-implemented prototyping method comprising the steps of:

identifying and selecting a design from a collection of alternate designs which best satisfies a set of conceptual level design specifications;

optimizing characteristics of the design based on the conceptual level design specifications;

modifying the specifications interactively using graphical interfaces for reevaluating and re-optimizing the designs;

simulating the functional and geometrical properties of the design and components of the design on a computer using graphical design browsers;

analyzing a performance of the design against a set of design specifications and effecting a redesign by interactively selecting one of the previous design operations through the graphical user interfaces;

wherein said simulation step includes:

solving a set of mathematical equations representing the functional behavior of the components, implemented using software programs residing in the computer memory, for design of components of the design;

incorporating components designed externally, without the help of said software programs, into the computer memory;

specifying the interrelationships of design components in terms of their functional properties as well as geometrical properties employing a set of matrix based databases and hierarchy graphs defined by a multi-level nodal hierarchy having each of the nodes representing a component of the design;

browsing the functionality and geometry of the design using a set of graphical interfaces in which the designs, its functional hierarchy, and its geometrical hierarchy are displayed; in which the user can select any one of the components shown on the display and examine or revise a corresponding hierarchy.

4. A computer-implemented prototyping method comprising the steps of:

identifying and selecting a design from a collection of alternate designs which best satisfies a set of conceptual level design specifications;

optimizing characteristics of the design based on the conceptual level design specifications;

modifying the specifications interactively using graphical interfaces for reevaluating and re-optimizing the designs;

simulating the functional and geometrical properties of the design and components of the design on a computer using graphical design browsers;

analyzing a performance of the design against a set of design specifications and effecting a redesign by interactively selecting one of the previous design operations through the graphical user interfaces;

wherein said identifying step includes:

using a knowledge base system including a user modifiable artificial intelligence based representation of a decision tree defined by an interconnected multi-level nodal hierarchy having a strength assigned to each of the interconnections between nodes in the hierarchy;

using a database including a stored database representation of the functional details of the design alternatives under consideration by the user, the database representation being consistent with the multi-level nodal hierarchy of the knowledge based system;

using a constraint solver implemented as a set of logic programs which evaluates the user specified constraints on the nodal variables in the nodal hierarchy against the functional details of the design alternatives represented in the database and computed nodal strengths during an evaluation process;

using a graphical user interface including a first edit window for designing, displaying and revising the decision tree in response to user input commands through a computer keyboard and mouse; and a second edit window for displaying the database representation and revising the database representation in response to user input commands; and a third edit window for displaying and revising the specifications against which the design are evaluated in response to user input commands; and further including a set of graphics panels for displaying intermediate and final results of the evaluation process;

wherein said simulation step includes:

solving a set of mathematical equations representing the functional behavior of the components, implemented using software programs residing in the computer memory, for design of components of the design;

incorporating components designed externally, without the help of software programs mentioned above, into the computer memory;

specifying the interrelationships of design components in terms of their functional properties as well as geometrical properties employing a set of matrix based databases and hierarchy graphs defined by a multi-level nodal hierarchy having each of the nodes representing a component of the design;

browsing the functionality and geometry of the design using a set of graphical interfaces in which the designs, its functional hierarchy, and its geometrical hierarchy are displayed; in which the user can select any one of the components shown on the display and examine or revise corresponding hierarchy.

5. A method according to claim 4, wherein the said analyzing step includes:

integrating the hierarchical representation of the properties with the knowledge base system and its decision tree hierarchy, implemented in the computer memory;

analyzing the sensitivity of each of the components against the design specifications represented through the knowledge base system, its nodal hierarchy, and against the user specified constraints;

visualizing the performance of the design graphically on the computer screen using multiple graphics panels, which capability for the user to interactively select each of the components of the design and visualize its functional as well a geometrical performance;

the user to stop the analysis process and store the conditions on to the computer memory, and graphically select any of said step, and revise associated specifications, nodal hierarchy, components hierarchy or the databases; and independently perform each of the steps with the conditions stored in the computer memory.

6. A computerized prototyping system comprising:

identifying means for identifying and selecting a design from a collection of alternate designs which best satisfies a set of conceptual level design specifications;

optimizing means for optimizing characteristics of the design based on the conceptual level design specifications;

modifying means for modifying the specifications interactively using graphical interfaces for re-evaluating and re-optimizing the designs;

simulating means for simulating functional and geometrical properties of the design and components of the design on a computer using graphical design browsers;

analyzing means for analyzing a performance of the design against a set of design specifications and effecting a redesign by interactively selecting one of the previous design operations through the graphical user interfaces;

wherein said identifying means includes:

a knowledge base system including a user modifiable artificial intelligence based representation of a decision tree defined by an interconnected multi-level nodal hierarchy having a strength assigned to each of the interconnections between nodes in the hierarchy;

a database including a stored database representation of the functional details of design alternatives under consideration by the user, the database representation being consistent with the multi-level nodal hierarchy of the knowledge based system;

a constraint solver implemented as a set of logic programs which evaluates user specified constraints on nodal variables in the nodal hierarchy against the functional details of the design alternatives represented in the database and computed nodal strengths during an evaluation process; and a graphical user interface including a first edit window for designing, displaying and revising the decision tree in response to user input commands through a computer keyboard and mouse; and a second edit window for displaying the database representation and revising the database representation in response to the user input commands; and a third edit window for displaying and revising the specifications against which the design are evaluated in response to the user input commands; and further including a set of graphics panels for displaying the intermediate and final results of the evaluation;

wherein the said optimizing means includes:

a neural network based representation of the nodal hierarchy with the interconnection strengths of the hierarchy implemented as weights in the neural network and the user specifications represented as an objective function at the output layer of the neural network, and the input variables corresponding to the functional details of the design being optimized stored in the database;

another graphical user interface including a front end for the user to specify a number of cycles through which the optimization is performed, and yet another graphical interface for specifying whether the optimization is performed on a single design or on a set of designs, and a set of colored graphics panels for displaying the intermediate and final results of the optimization, and another graphical interface to allow the user to revise design specifications and re-optimize the designs.

7. A computerized prototyping system comprising:

a knowledge base system including a user modifiable artificial intelligence based representation of a decision tree defined by an interconnected multi-level nodal hierarchy having a strength assigned to each of the interconnections between nodes in the hierarchy;

a database including a stored database representation of the functional details of design alternatives under consideration by the user, the database representation being consistent with the multi-level nodal hierarchy of the knowledge based system;

a constraint solver implemented as a set of logic programs which evaluates user specified constraints on nodal variables in the nodal hierarchy against the functional details of the design alternatives represented in the database and computed nodal strengths during an evaluation process;

a graphical user interface including a first edit window for designing, displaying and revising the decision tree in response to user input commands through a computer keyboard and mouse; and a second edit window for displaying the database representation and revising the database representation in response to the user input commands; and a third edit window for displaying and revising the specifications against which the design are evaluated in response to the user input commands; further including a set of graphics panels for displaying the intermediate and final results of the evaluation;

a neural network based representation of the nodal hierarchy with the interconnection strengths of the hierarchy implemented as weights in the neural network and the user specifications represented as an objective function at the output layer of the neural network, and the input variables corresponding to the functional details of the design being optimized stored in the database;

another graphical user interface including a front end for the user to specify the number of cycles through which the optimization is performed, and yet another graphical interface for specifying whether the optimization is performed on a single design or on a set of designs, and a set of colored graphics panels for displaying the intermediate and final results of the optimization, and another graphical interface to allow the user to revise design specifications and re-optimize the designs.

* * * * *